United States Patent
Makiyama

(10) Patent No.: US 10,199,489 B2
(45) Date of Patent: Feb. 5, 2019

(54) COMPOUND SEMICONDUCTOR DEVICE AND METHOD OF MANUFACTURING COMPOUND SEMICONDUCTOR DEVICE

(71) Applicant: FUJITSU LIMITED, Kawasaki-shi, Kanagawa (JP)

(72) Inventor: Kozo Makiyama, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/716,015

(22) Filed: Sep. 26, 2017

(65) Prior Publication Data

US 2018/0108768 A1 Apr. 19, 2018

(30) Foreign Application Priority Data

Oct. 13, 2016 (JP) ................. 2016-201427

(51) Int. Cl.
*H01L 29/778* (2006.01)
*H01L 29/66* (2006.01)
*H01L 21/285* (2006.01)
*H01L 29/205* (2006.01)
*H01L 29/20* (2006.01)
*H01L 29/32* (2006.01)

(52) U.S. Cl.
CPC .... *H01L 29/7787* (2013.01); *H01L 21/28587* (2013.01); *H01L 29/205* (2013.01); *H01L 29/66462* (2013.01); *H01L 29/7786* (2013.01); *H01L 29/2003* (2013.01); *H01L 29/32* (2013.01)

(58) Field of Classification Search
CPC .......................... H01L 29/7787; H01L 29/2003
USPC ............................................................. 257/76
See application file for complete search history.

(56) References Cited

U.S. PATENT DOCUMENTS

| 2005/0258451 A1 | 11/2005 | Saxler et al. | |
| 2014/0091309 A1* | 4/2014 | Hallin | H01L 29/66462 257/76 |
| 2014/0264379 A1* | 9/2014 | Kub | H01L 29/41725 257/77 |

FOREIGN PATENT DOCUMENTS

| JP | 2004-165387 | 6/2004 |
| JP | 2007-538402 | 12/2007 |

* cited by examiner

*Primary Examiner* — Igwe U Anya
(74) *Attorney, Agent, or Firm* — Fujitsu Patent Center

(57) ABSTRACT

A compound semiconductor device disclosed herein includes: a GaN carrier transit layer formed on a substrate; a barrier layer formed on the carrier transit layer; a first recess and a second recess formed in the barrier layer; a first InAlN layer and a second InAlN layer formed in the first recess and the second recess respectively, a composition ratio of In in the InAlN layers being equal to or more than 17% and equal to or less than 18%; a source electrode formed on the first InAlN layer; a drain electrode formed on the second InAlN layer; and a gate electrode formed on the barrier layer.

11 Claims, 24 Drawing Sheets

COMPOUND SEMICONDUCTOR DEVICE AND METHOD OF MANUFACTURING COMPOUND SEMICONDUCTOR DEVICE

CROSS-REFERENCE TO RELATED APPLICATION(s)

This application is based upon and claims the benefit of priority of the prior Japanese Patent Application No. 2016-201427, filed on Oct. 13, 2016, the entire contents of which are incorporated herein by reference.

FIELD

The embodiments discussed herein are related to a compound semiconductor device and a method of manufacturing a compound semiconductor device.

BACKGROUND

There are various types of compound semiconductor devices. Among them, a high electron mobility transistor (HEMT) has low noise and is capable of operating at high speed. Exploiting these advantages, the HEMT is used in a base station for a mobile phone and the like.

In the HEMT, a two-dimensional electron gas induced in a carrier transit layer serves as carriers. Various materials can be used as the material of the carrier transit layer. When a nitride semiconductor such as GaN is used as the material of the carrier transit layer, the withstanding voltage of the HEMT can be increased due to a high band gap of the nitride semiconductor.

In order to induce the two-dimensional electron gas in a GaN layer which is the carrier transit layer, an AlGaN layer which has a lattice constant different from the GaN layer may be formed on the GaN layer. In this case, the lattice constant difference between the layers causes distortion in the AlGaN layer. Such a distortion induce piezoelectric polarization or spontaneous polarization in the AlGaN layer, which in turn induces the two-dimensional electron gas in the GaN layer which is the carrier transit layer.

Moreover, a barrier is formed at an interface between the GaN layer and the AlGaN layer because of different materials of the two layers, and the two-dimensional electron gas described above accumulates near the barrier.

The AlGaN layer is referred to also as a barrier layer, which induces the carrier in the carrier transit layer and which causes a barrier between the AlGaN layer and the carrier transit layer in this manner.

Note that the techniques related to the present application are disclosed in Japanese National Publication of International Patent Application No. 2007-538402 and Japanese Laid-open Patent Publication No. 2004-165387.

By the way, compound semiconductor layers which can be formed as the barrier layer include an InAlGaN layer in addition to the AlGaN layer described above. The InAlGaN layer has spontaneous polarization higher than that of the AlGaN layer and can thus induce a high-density two-dimensional electron gas in the carrier transit layer.

However, the InAlGaN layer has a wider band gap than the AlGaN layer. Accordingly, it is difficult to form ohmic contacts with the source electrode and the drain electrode. Hence, it is difficult to take out a drain current from these electrodes and this leads to a decrease in the drain current.

SUMMARY

According to one aspect discussed herein, there is provided a compound semiconductor device including: a substrate; a carrier transit layer formed on the substrate and made of GaN; a barrier layer made of a nitride semiconductor and formed on the carrier transit layer, where a barrier is formed between the carrier transit layer and the barrier layer; a first recess formed in the barrier layer and having a depth reaching the carrier transit layer; a second recess formed in the barrier layer at an interval from the first recess and having a depth reaching the carrier transit layer; a first InAlN layer formed in the first recess, a composition ratio of In in the first InAlN layer being equal to or more than 17% and equal to or less than 18%; a second InAlN layer formed in the second recess, a composition ratio of In in the second InAlN layer being equal to or more than 17% and equal to or less than 18%; a source electrode formed on the first InAlN layer; a drain electrode formed on the second InAlN layer; and a gate electrode formed on the barrier layer between the source electrode and the drain electrode.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Prior to describing the embodiments, the matters studied by the inventors of the present application will be explained.

Figure 1:
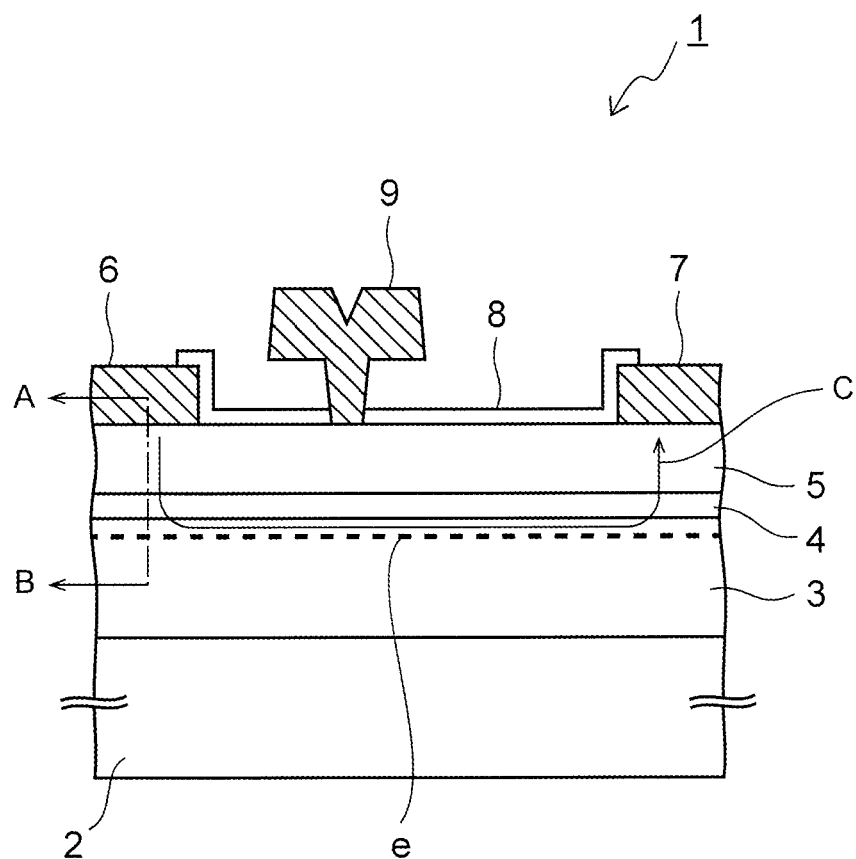
FIG. 1 is a cross-sectional view of a compound semiconductor device used for study.

FIG. 1 is a cross-sectional view of a compound semiconductor device used for this study.

This compound semiconductor device 1 is a HEMT, which includes a SiC substrate 2 and a carrier transit layer 3 of GaN formed on the SiC substrate 2.

Moreover, an intermediate layer 4 and a barrier layer 5 are formed in this order on the carrier transit layer 3.

Among them, the intermediate layer 4 plays a role of preventing a surface of the carrier transit layer 3 from roughening after forming the carrier transit layer 3, and an AlN layer is formed as the intermediate layer 4 in this example.

Moreover, an InAlGaN layer which has a lattice constant different from the carrier transit layer 3 is formed as the barrier layer 5. Such a difference in lattice constant causes piezoelectric polarization and spontaneous polarization in the barrier layer 5, and a two-dimensional electron gas e is thereby generated in the carrier transit layer 3.

Particularly, since the piezoelectric polarization and the spontaneous polarization in the InAlGaN layer are higher than those in an AlGaN layer, a high-density two-dimensional electron gas e can be generated in the carrier transit layer 3. This two-dimensional electron gas e functions as carriers and accumulates in the carrier transit layer 3 close to the intermediate layer 4.

Then, a source electrode 6, a drain electrode 7, and a gate electrode 9 are formed at intervals on the barrier layer 5.

Moreover, a silicon nitride film is formed on a surface of the barrier layer 5 as a passivation layer 8, which protects the surface from moisture in the atmosphere and the like.

A current path C in such a HEMT is formed to extend from the source electrode 6 to the drain electrode 7 via the carrier transit layer 3. In order to make carriers to easily flow along the current path C, a barrier ΔE between the source electrode 6 and the barrier layer 5 may be lowered.

Figure 2:
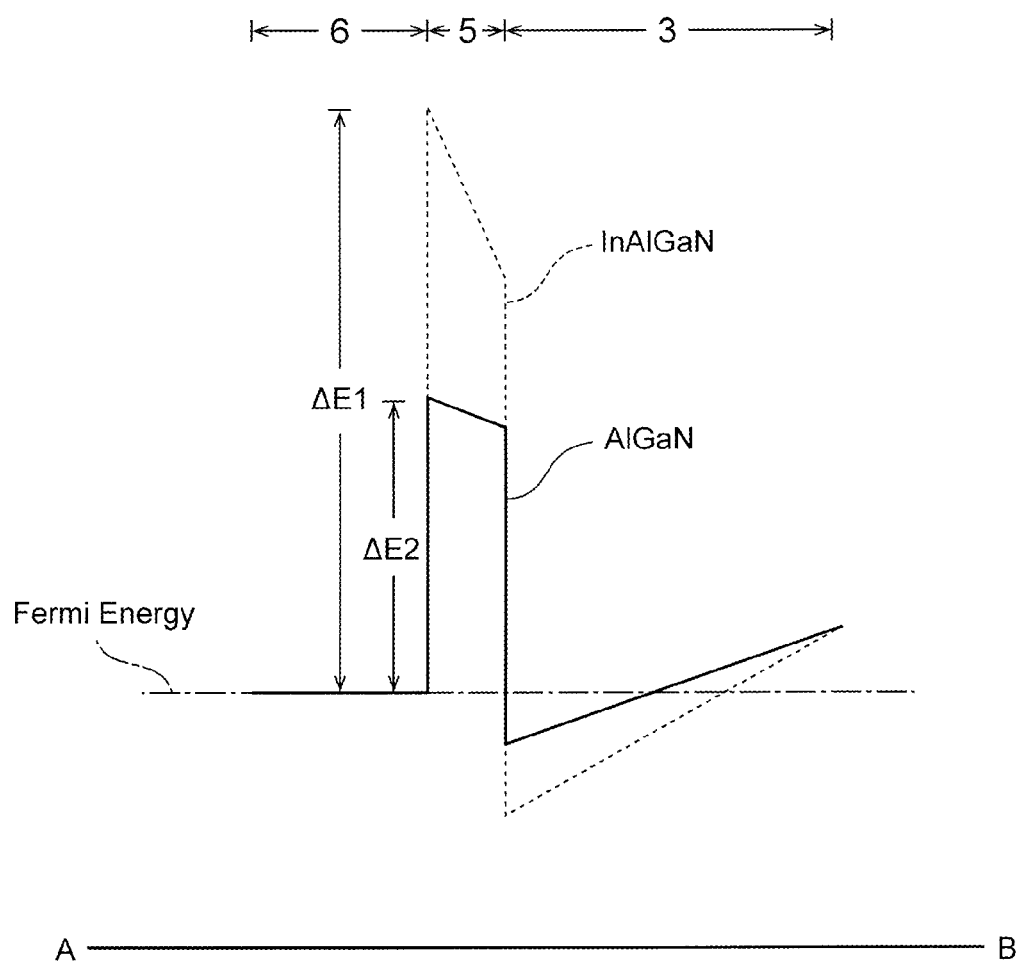
FIG. 2 is a diagram illustrating a band structure along the line A-B in FIG. 1.

FIG. 2 is a diagram illustrating a band structure along the line A-B in FIG. 1. Note that the intermediate layer 4 is omitted in the band structure of FIG. 2.

As described above, the InAlGaN layer capable of inducing the high-density two-dimensional electron gas e is formed as the barrier layer 5 in this example. In FIG. 2, a band structure in the case where the AlGaN layer is used instead of the InAlGaN layer as the barrier layer 5 is also illustrated for comparison.

As illustrated in FIG. 2, in the case where the InAlGaN layer is formed as the barrier layer 5, a barrier ΔE1 between the source electrode 6 and the barrier layer 5 becomes higher than a barrier ΔE2 in the case where the AlGaN layer is formed as the barrier layer 5, due to a wide band gap Eg of InAlGaN.

In this case, it is difficult to inject electrons from the source electrode 6 into the barrier layer 5. Thus, formation of a preferable ohmic contact between the source electrode 6 and the barrier layer 5 is difficult. As a result, the contact resistance between the source electrode 6 and the barrier layer 5 increases and the drain current of the HEMT decreases, thereby causing a decrease in an amplification performance of the HEMT.

Figure 3:
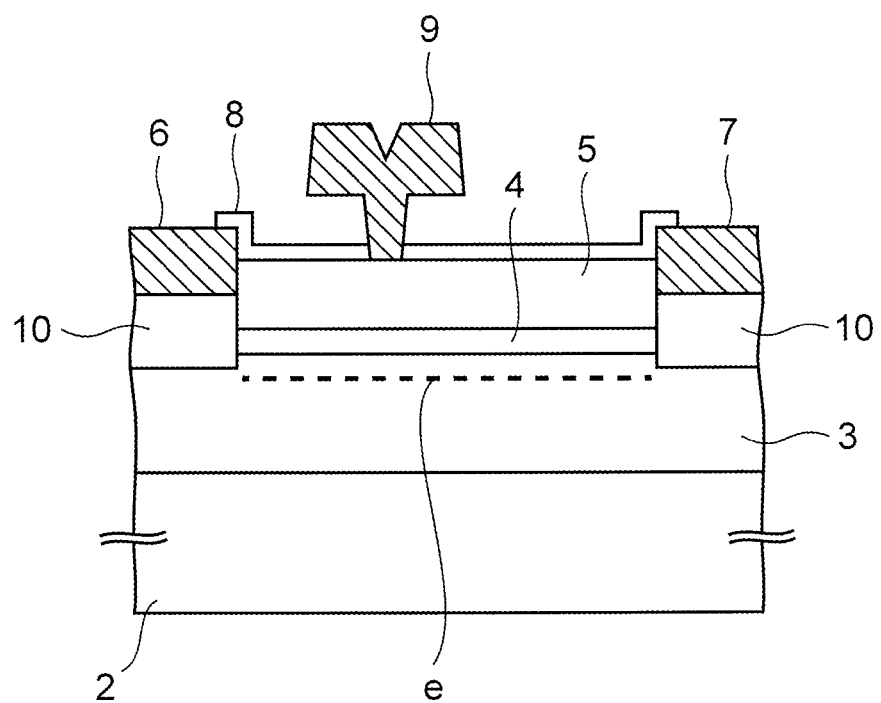
FIG. 3 is a cross-sectional view of a structure devised to solve problems in the compound semiconductor device used for the study.

FIG. 3 is a cross-sectional view of a structure devised to solve this problem.

Note in FIG. 3 that the same elements as those in FIG. 1 are denoted by the same reference numerals as those in FIG. 1 and description thereof is omitted below.

In the example of FIG. 3, the intermediate layer 4 and the barrier layer 5 are removed from portions under the source electrode 6 and the drain electrode 7, and an n-type GaN regrowth layer 10 is formed in the removed portions.

Since the band gap of GaN is narrower than that of InAlGaN, it may be thought that the contact resistance between the source electrode 6 and the regrowth layer 10 can be reduced by forming the regrowth layer 10 in this manner.

However, since the n-type GaN layer formed as the regrowth layer 10 is made of the same material as the GaN layer of the carrier transit layer 3, there is no difference in lattice constant between the regrowth layer 10 and the carrier transit layer 3. Accordingly, no polarization is caused by the regrowth layer 10, and the two-dimensional electron gas e caused by the polarization is less likely to be induced in the carrier transit layer 3 under the regrowth layer 10.

In order to confirm this, the inventors of the present application calculated an electron density distribution in the structure of FIG. 3. The result is illustrated in FIG. 4.

Note that the intermediate layer 4 is omitted in this calculation.

Figure 4:
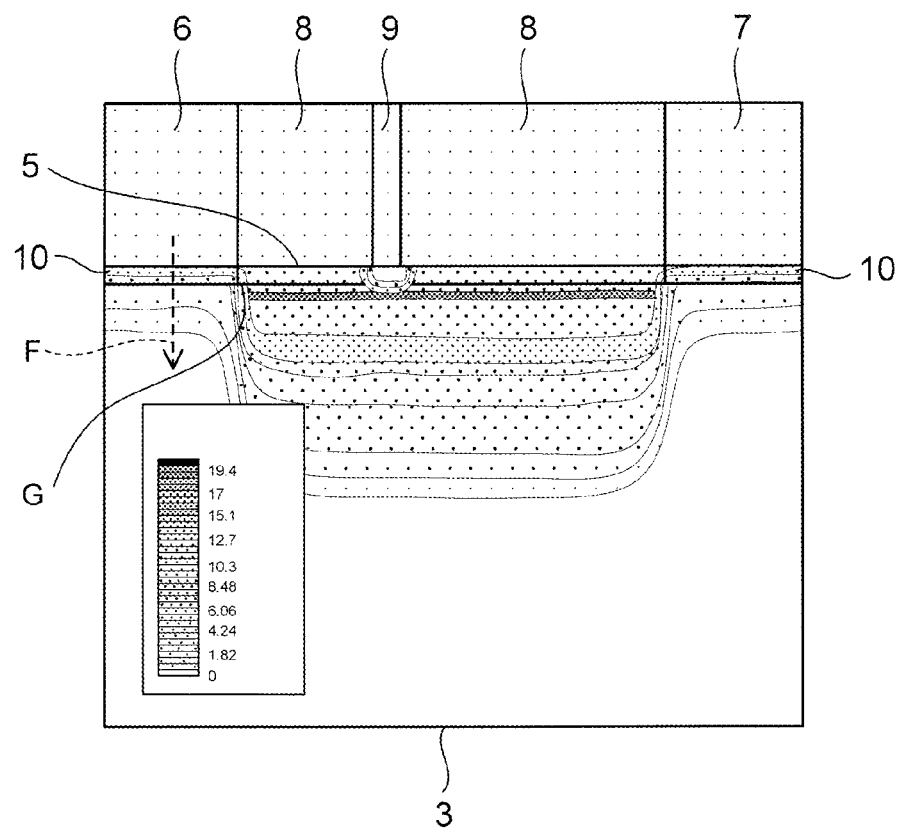
FIG. 4 is a diagram obtained by calculating an electron density distribution in the structure of FIG. 3.

As illustrated in FIG. 4, the electron density just under the regrowth layer 10 is lower than the electron density under the barrier layer 5.

When the electron density is low just under the regrowth layer 10 in this manner, it is difficult for electrons to flow in a direction from the source electrode 6 toward the carrier transit layer 3 as illustrated by the arrow F, and the drain current decreases.

Moreover, when it is difficult for the drain current to flow in the direction of the arrow F in this manner, the direction in which the drain current flows is limited to a lateral direction of the substrate. As a result, the current concentrates at a corner portion G of the regrowth layer 10, and the drain current further decreases.

In the following, embodiments capable of suppressing the decrease in drain current will be described.

First Embodiment

FIGS. 5A to 5M are cross-sectional views of a compound semiconductor device in the course of manufacturing thereof according to the present embodiment.

In the present embodiment, a HEMT is manufactured as the compound semiconductor device as described below.

Figure 5A:
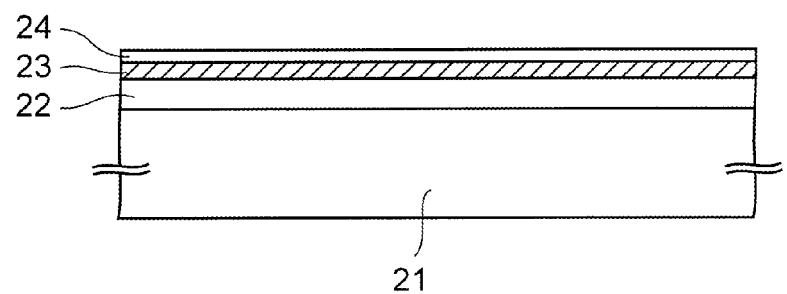
FIGS. 5A to 5M are cross-sectional views of a compound semiconductor device in the course of manufacturing thereof according to a first embodiment.

First, as illustrated in FIG. 5A, a semi-insulating SiC substrate is prepared as a substrate 21, and an unillustrated AlN layer is formed as a nucleation layer on the substrate 21 by a metal organic vapor phase epitaxy (MOVPE) method. Then, a GaN layer having a thickness of about 1 μm is formed as a buffer layer 22 on the nucleation layer by the MOVPE method.

Thereafter, a GaN layer is formed as a carrier transit layer 23 on the buffer layer 22 by the MOVPE method to a thickness of about 100 nm. Although there is a difference in lattice constant between the substrate 21 and the carrier transit layer 23, lattice mismatch between the substrate 21 and the carrier transit layer 23 can be reduced by forming the buffer layer 22 between the substrate 21 and the carrier transit layer 23.

Moreover, a film formation condition of the carrier transit layer 23 is not particularly limited. In the present embodiment, the carrier transit layer 23 is formed by setting the substrate temperature to about 900° C. to 1200° C., while using a mixed gas of trimethylgalium (TMG) gas, ammonia ($NH_3$) gas, and hydrogen ($H_2$) gas as a film formation gas.

Note that, when the substrate temperature is lowered after forming the carrier transit layer 23, the surface of the carrier transit layer 23 roughens and defects are likely to occur in the carrier transit layer 23.

Accordingly, in the present embodiment, after the carrier transit layer 23 is formed, a surface of the carrier transit layer 23 is covered with a first intermediate layer 24 while maintaining the substrate temperature at about 900° C. to 1200° C. without lowering the substrate temperature.

The first intermediate layer 24 is an AlN layer having a thickness of about 1 nm and formed by the MOVPE method. After the formation of the first intermediate layer 24, the substrate temperature is reduced to 1000° C. or lower.

By covering the carrier transit layer 23 with the first intermediate layer 24 in this manner, the surface of the carrier transit layer 23 can be prevented from roughening when the substrate temperature is reduced.

Figure 5B:
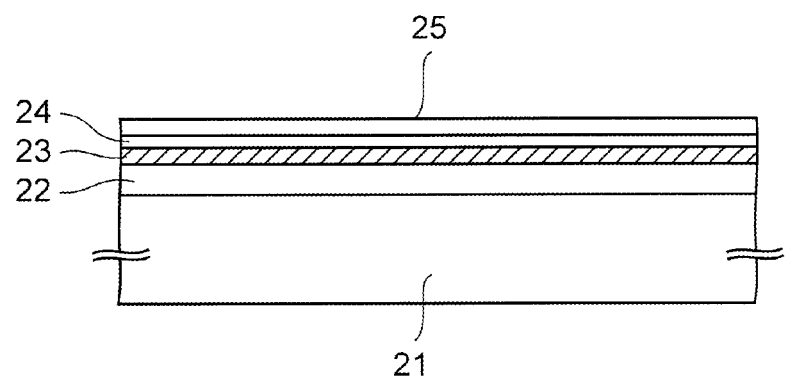

Next, as illustrated in FIG. 5B, an InAlGaN layer having a thickness of about 10 nm is formed as a barrier layer 25 on the first intermediate layer 24 by the MOVPE method under the condition where the substrate temperature is 600° C. to 800° C. A film formation gas for the barrier layer 25 is, for example, a mixed gas of trimethylindium (TMI) gas, trimethylaluminum (TMA) gas, TMG gas, ammonia gas, and hydrogen gas.

Since the InAlGaN layer formed as the barrier layer 25 has high spontaneous polarization as described above, a high-density two-dimensional electron gas may be induced in the carrier transit layer 23.

Note that, when the density of the two-dimensional electron gas in the carrier transit layer does not need to be high, a nitride semiconductor other than InAlGaN may be employed as the material of the barrier layer 25. Examples of such nitride semiconductors include AlGaN.

Figure 5C:
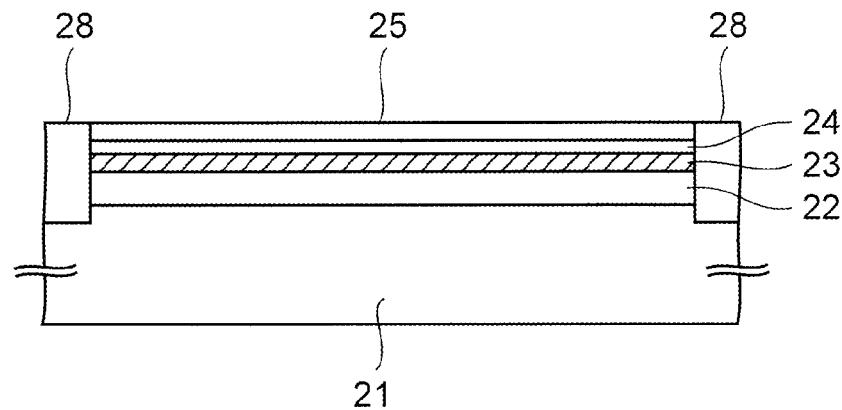

Next, as illustrated in FIG. 5C, argon ions are implanted into the substrate 21 from a surface of the barrier layer 25 to form device isolation regions 28, and thus an active region is defined by the device isolation regions 28.

Figure 5D:
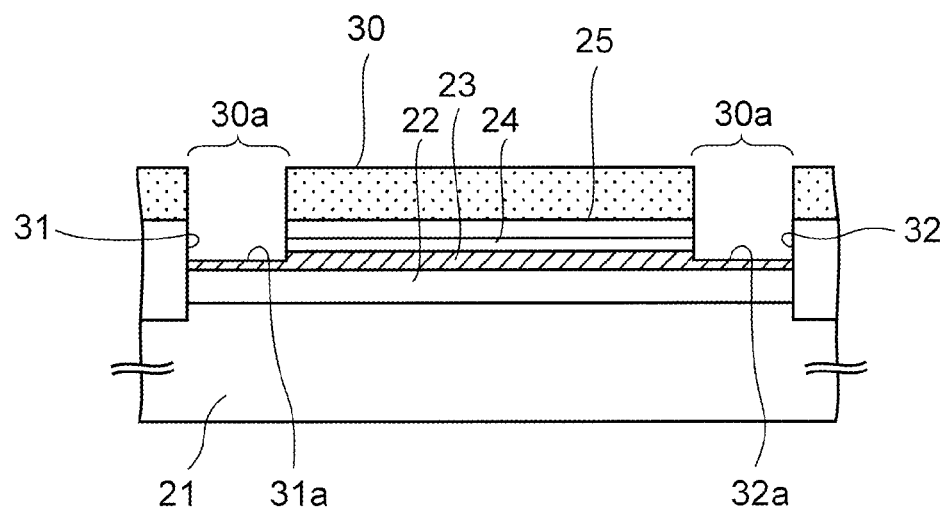

Next, the step illustrated in FIG. 5D is described.

First, a first resist layer 30 is applied onto the barrier layer 25. Then, the first resist layer 30 is exposed and developed to form two openings 30a at an interval in the first resist layer 30.

Then, the carrier transit layer 23, the first intermediate layer 24, and the barrier layer 25 are dry etched through the openings 30a to form a first recess 31 and a second recess 32 at a distance from each other. Here, the recesses 31, 32 have depth reaching the carrier transit layer 23.

These recesses 31, 32 have a first bottom surface 31a and a second bottom surface 32a respectively, and the carrier transit layer 23 is exposed on the bottom surfaces 31a, 32a.

Note that an etching gas used in the dry etching is not particularly limited, and a chlorine ($Cl_2$) gas may be used as the etching gas.

Thereafter, the first resist layer 30 is removed with a heated organic solvent.

Figure 5E:
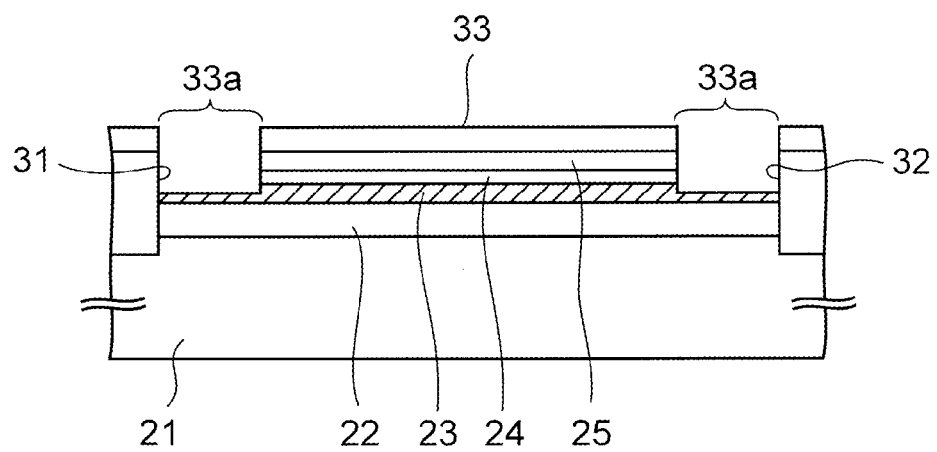

Next, as illustrated in FIG. 5E, a silicon oxide layer is formed as a mask layer 33 on the barrier layer 25 and in the recesses 31, 32 by a CVD method, and then the mask layer 33 is patterned to form openings 33a on the recesses 31, 32.

Figure 5F:
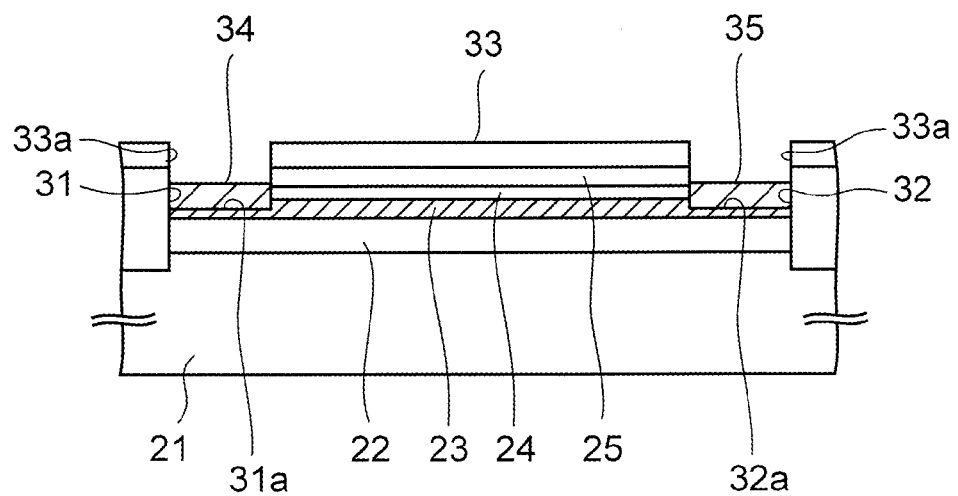

Then, as illustrated in FIG. 5F, a first InAlN layer 34 and a second InAlN layer 35 having a thickness of about 5 nm are regrown on the bottom surfaces 31a, 32a of the recesses 31, 32 exposed from the openings 33a by a molecular beam epitaxy (MBE) method under the condition where the substrate temperature is 600° C. to 900° C.

In this MBE method, In and Al are evaporated in a resistance heating cell in an unillustrated high-vacuum chamber to generate beam of these materials, and the beam is irradiated onto the substrate 21 to deposit In and Al in the recesses 31, 32. Moreover, the InAlN layers 34, 35 may be formed by employing nitrogen or ammonia as a nitrogen source and forming a radical of the nitrogen source.

Note that a preferable composition ratio of In in each of the InAlN layers 34, 35 are described later.

Moreover, the first InAlN layer 34 and the second InAlN layer 35 may be regrown by the MOVPE method instead of the MBE method. In this case, the first InAlN layer 34 and the second InAlN layer 35 are formed under the condition where a mixed gas of TMI gas, TMA gas, ammonia gas, and hydrogen gas is used as a film formation gas, the substrate temperature is 600° C. to 800° C., and the pressure of a film formation atmosphere is 1 kPa to 100 kPa. The composition ratio of each of the InAlN layers 34, 35 may be controlled by, for example, adjusting the flow rate ratio of the TMI gas and the TMA gas in the aforementioned film formation gas.

Thereafter, the mask layer 33 is removed by wet etching.

Figure 5G:
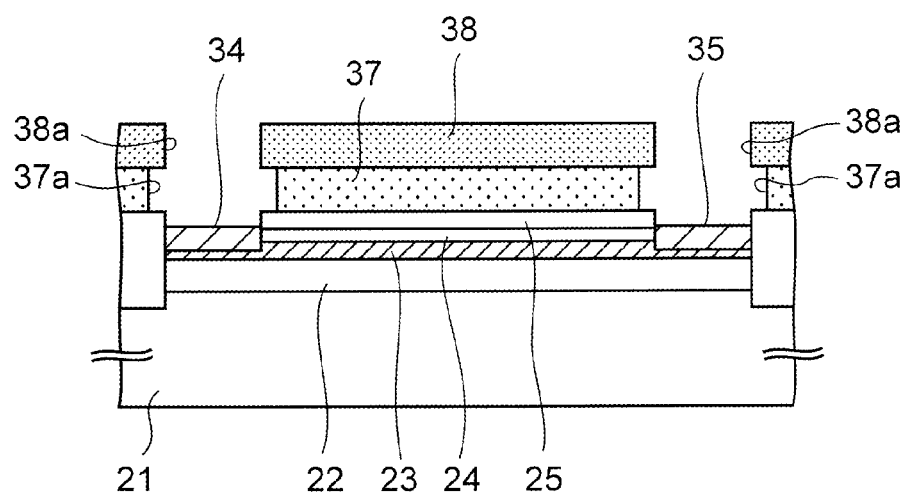

Next, as illustrated in FIG. 5G, a second resist layer 37 and a third resist layer 38 are formed in this order on an entire upper surface of the substrate 21. In this example, PMGI manufactured by MicroChem Corp. is used as the material of the second resist layer 37, and ZEP520 manufactured by Zeon Corporation is used as the material of the third resist layer 38.

Then, after the third resist layer 38 is exposed to an electron beam, the third resist layer 38 is developed by using ZEP-SD manufactured by Zeon Corporation to form openings 38a over the first InAlN layer 34 and the second InAlN layer 35, respectively.

Furthermore, the second resist layer 37 is wet etched through the openings 38a to form openings 37a, having side surfaces set back from the openings 38a, in the second resist layer 37. Examples of etchant which may be used in this wet etching include NMD-W manufactured by TOKYO OHKA KOGYO CO., LTD.

Note that, although the third resist layer 38 is exposed to the electron beam in this example, an i-line resist layer may be formed as the third resist layer 38 and expose it to i-line light. Examples of such an i-line resist layer include PFI-32A manufactured by Sumitomo Chemical Company, Limited.

Figure 5H:
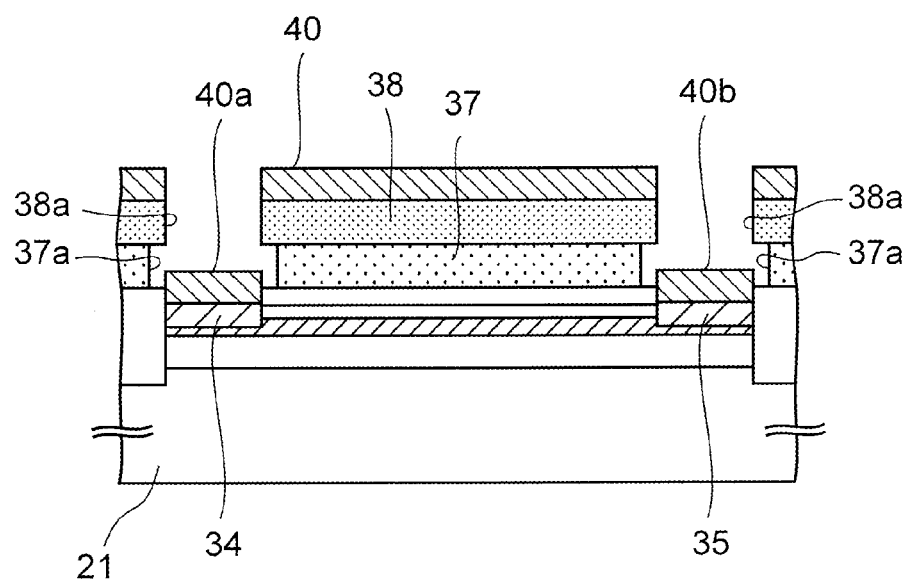

Next, as illustrated in FIG. 5H, a titanium layer having a thickness of about 20 nm and an aluminum layer having a thickness of about 200 nm are formed in this order as a metal stacked film 40 on the third resist layer 38 and on the InAlN layers 34, 35 exposed from the openings 37a, 38a by a vapor deposition method.

Thereafter, the second resist layer 37 and the third resist layer 38 are lifted off, and portions of the metal stacked film 40 formed on the InAlN layers 34, 35 are thereby used as a source electrode 40a and a drain electrode 40b, respectively.

At this time, since the side surfaces of the openings 37a are set back from the openings 38a as described above, it is possible to separate the source electrode 40a and the drain electrode 40b from the metal stacked film 40 on the third resist layer 38, making it possible to prevent the metal stacked film 40 from remaining after the lift-off.

Figure 5I:
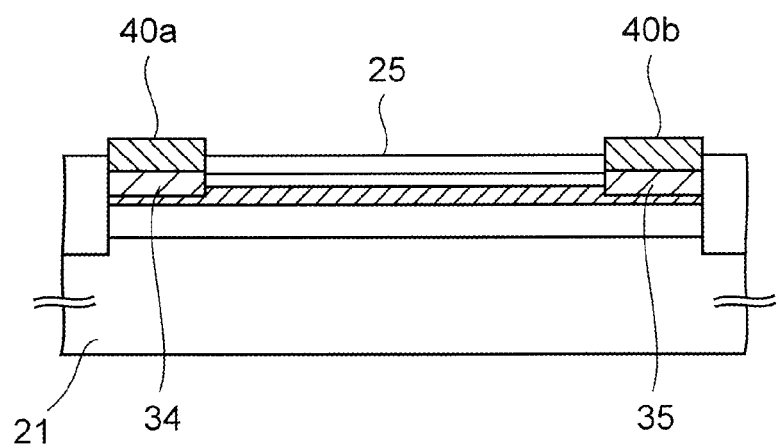

Next, as illustrated in FIG. 5I, the source electrode 40a and the drain electrode 40b are heated in a nitrogen atmosphere under the condition where the substrate temperature is about 550° C. Thus, the materials of the source electrode 40a and the drain electrode 40b diffuse into the InAlN layers 34, 34, and ohmic contacts between the source electrode 40a and the first InAlN layer 34 and between the drain electrode 40b and the second InAlN layer 35 can be achieved.

Figure 5J:
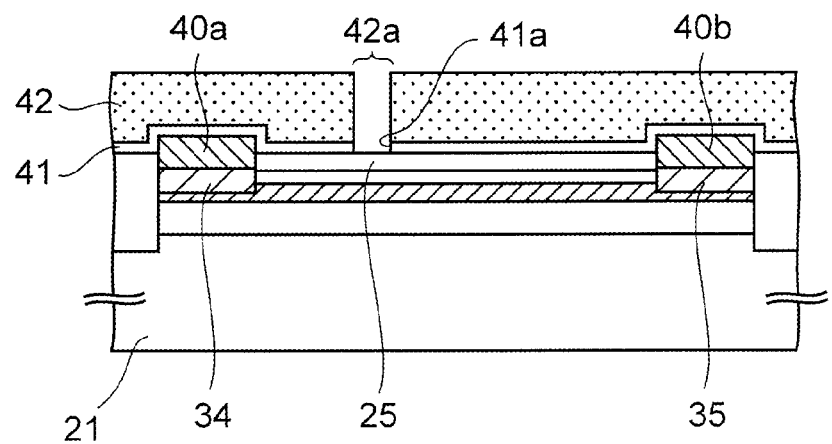

Next, the step illustrated in FIG. 5J is described.

First, a silicon nitride layer having a thickness of about 50 nm is formed as a passivation layer 41 on the barrier layer 25, the source electrode 40a, and the drain electrode 40b by a plasma CVD method using silane ($SiH_4$) gas and ammonium gas as a film formation gas. Note that the refractive index of the passivation layer 41 is about 2.0 for light with a wavelength of 633 nm.

Thereafter, PMMA manufactured by MicroChem Corp. is applied as a fourth resist layer 42 on the passivation layer 41. Then, after the fourth resist layer 42 is exposed to an electron beam, the fourth resist layer 42 is developed to form an opening 42a, having a diameter of about 0.1 µm, in the fourth resist layer 42.

Then, the passivation layer 41 is dry etched through the opening 42a while using $SF_6$ gas as an etching gas to form an opening 41a between the source electrode 40a and the drain electrode 40b, and the barrier layer 25 is exposed from the opening 41a.

Thereafter, the fourth resist layer 42 is removed.

Figure 5K:
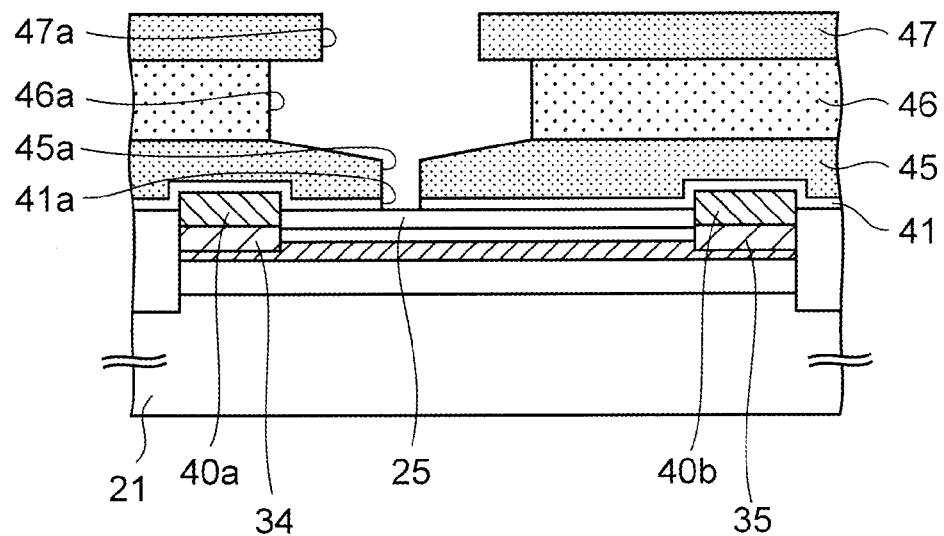

Next, as illustrated in FIG. 5K, fifth to seventh resist layers 45 to 47 are formed in this order on the passivation layer 41.

The materials of the resist layers 45 to 47 are not particularly limited. In this example, PMMA manufactured by MicroChem Corp. is used as the material of the fifth resist layer 45, and PMGI manufactured by MicroChem Corp. is used as the material of the sixth resist layer 46. Moreover, ZEP520 manufactured by Zeon Corporation is used as the material of the seventh resist layer 47.

Next, the seventh resist layer 47 is exposed to an electron beam and then developed by using developer ZEP-SD manufactured by Zeon Corporation to form an opening 47a having a width of about 0.8 µm in the seventh resist layer 47.

Thereafter, the sixth resist layer 46 is wet etched through the opening 47a to form an opening 46a, having a side surface set back from the opening 47a by 0.5 µm, in the sixth resist layer 46. For example, NMD-W manufactured by TOKYO OHKA KOGYO CO., LTD. is used as etchant in this wet etching.

Furthermore, the fifth resist layer 45 exposed from the opening 46a is exposed to an electron beam and then developed by using developer ZMD-B manufactured by Zeon Corporation. to form an opening 45a having a diameter of about 0.15 µm over the opening 41a.

Figure 5L:
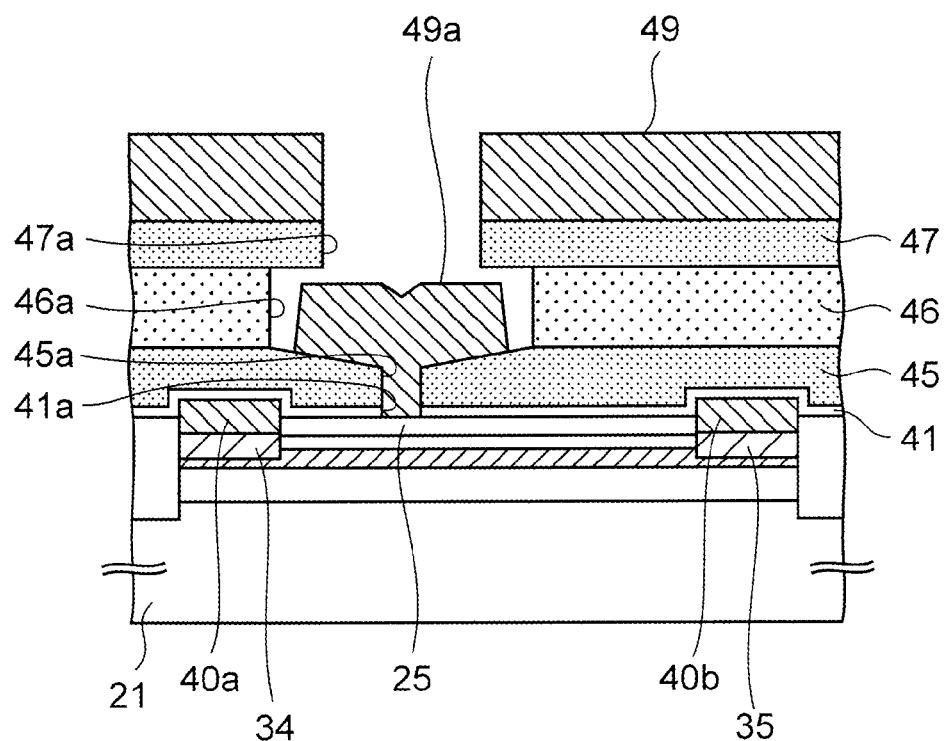

Next, as illustrated in FIG. 5L, a nickel layer having a thickness of about 10 nm and a gold layer having a thickness of about 300 nm are formed in this order as a metal stacked film 49 on the seventh resist layer 47 by the vapor deposition method.

The metal stacked film 49 is also formed in the opening 45a, 46a and 47a, and thus a mushroom-shaped gate electrode 49a is formed on the barrier layer 25 exposed from the opening 41a.

Figure 5M:
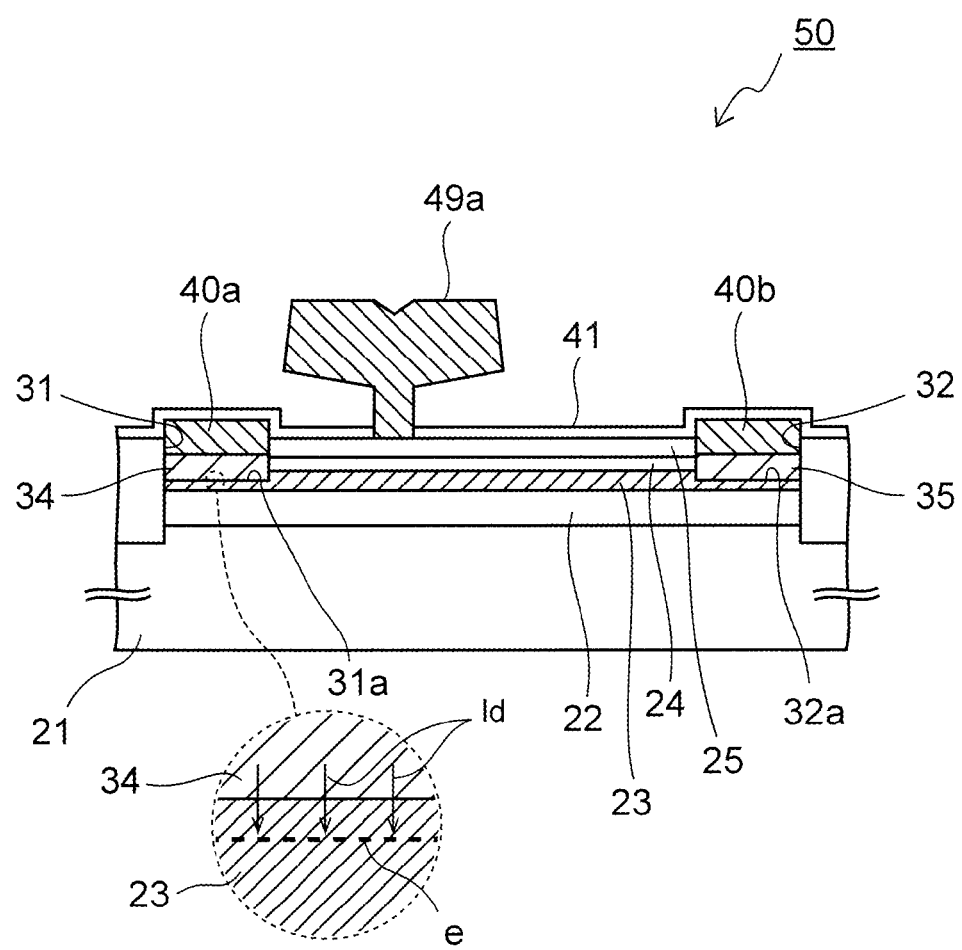

Thereafter, as illustrated in FIG. 5M, the resist layers 45 to 47 are dissolved and removed by using a heated organic solvent.

Thus, a basic structure of the compound semiconductor device 50 according to the embodiment is completed.

In the compound semiconductor device 50, the first InAlN layer 34 is formed in the first recess 31 as described above. There is a large polarization difference between the first InAlN layer 34 and the GaN layer formed as the carrier transit layer 23, and the high-density two-dimensional electron gas e is formed in the carrier transit layer 23 under the first InAlN layer 34 to cancel this polarization difference.

Such a high-density two-dimensional electron gas e facilitates the ohmic contact between the first InAlN layer 34 and the source electrode 40a, and thus the contact resistance between the first InAlN layer 34 and the source electrode 40a can be reduced.

Particularly, since the InAlGaN layer is a material which has a wide band gap and with which the ohmic contact is difficult to achieve as illustrated in FIG. 2, reducing the contact resistance is practically beneficial when the InAlGaN layer is formed as the barrier layer 25.

Moreover, as a result of reducing the contact resistance in this manner, the drain current Id can flow so as to penetrate the entire lower surface of the first InAlN layer 34, which in turn increases the drain current Id.

Furthermore, the contact resistance between the second InAlN layer 35 and the drain electrode 40b is reduced by the same reason as that described above, and the drain current Id flowing between the second InAlN layer 35 and the drain electrode 40b can be increased.

Note that, when the film thickness of the first InAlN layer 34 is too thick, it is difficult to inject electrons from the source electrode 40a into the carrier transit layer 23 via the first InAlN layer 34.

The total thickness of the first intermediate layer 24 and the barrier layer 25 may be employed as a criterion of the thickness of the first InAlN layer 34 at which the injection of electrons from the source electrode 40a into the carrier transit layer 23 becomes difficult. Thus, in the present embodiment, the first InAlN layer 34 is formed thinner than this total thickness, thereby making it easy to inject electrons from the source electrode 40a into the carrier transit layer 23.

By the same reasons as this, the second InAlN layer 35 is preferably formed thinner than the total thickness of the first intermediate layer 24 and the barrier layer 25, in order to make it easy to extract electrons from the drain electrode 40b.

The inventors of the present application calculated an electron density distribution in the compound semiconductor device 50 in order to confirm to what extent the density of the two-dimensional electron gas induced in the carrier transit layer 23 is actually increased by the InAlN layers 34, 35.

Figure 6:
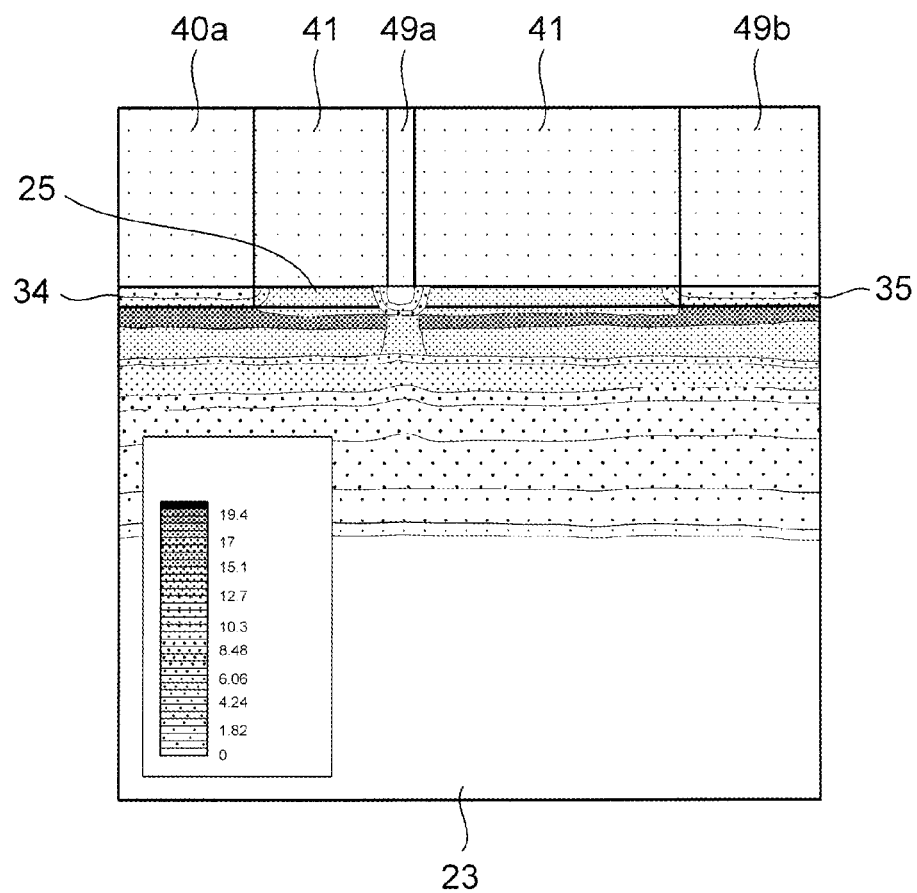
FIG. 6 is a diagram obtained by calculating an electron density distribution in the compound semiconductor device according to the first embodiment.

The result of this calculation is illustrated in FIG. 6. Note that the first intermediate layer 24 is omitted in this calculation.

As illustrated in FIG. 6, the density of the two-dimensional electron gas induced in the carrier transit layer 23 under each of the InAlN layers 34, 35 is as high as the density of the two-dimensional electron gas induced under the barrier layer 25.

Such an increase in the density of the two-dimensional electron gas can increase the drain current in the present embodiment as described above.

In order to confirm that the drain current actually increases, the inventors of the present application calculated characteristics of three terminals of the compound semiconductor device in the present embodiment.

Figure 7A:
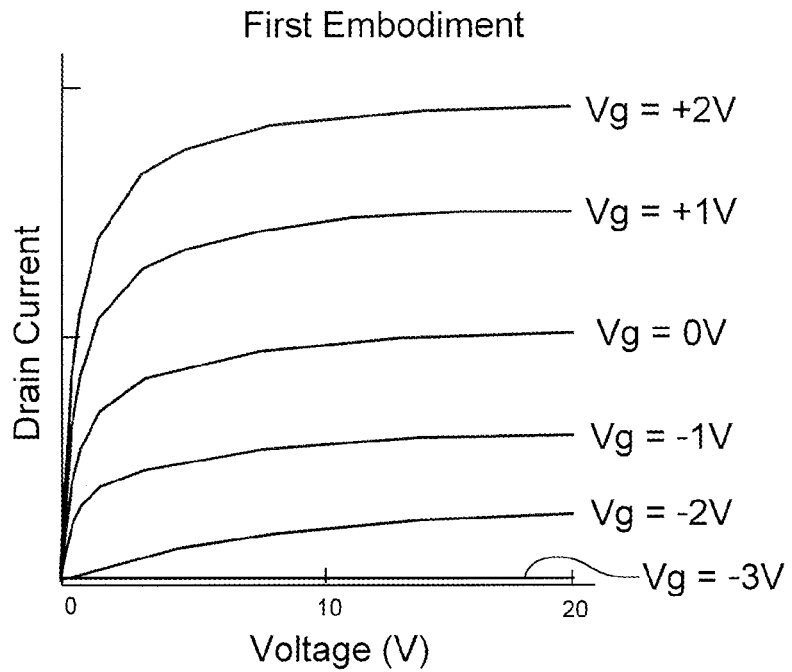
FIG. 7A is a graph obtained by calculating characteristics of three terminals of the compound semiconductor device according to the first embodiment.

The result of this calculation is illustrated in FIG. 7A. FIG. 7A is a graph obtained by calculating the characteristics of the three terminals of the compound semiconductor device 50 according to the present embodiment.

Moreover, in this study, the compound semiconductor device 1 illustrated in FIG. 1 is used as a comparative example, and characteristics of three terminals of the compound semiconductor device 1 are also calculated.

Figure 7B:
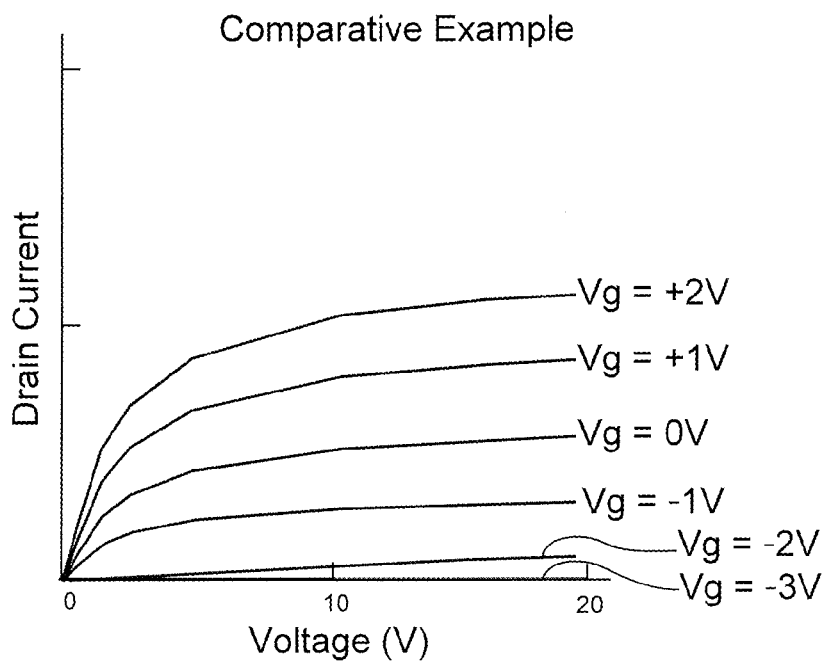
FIG. 7B is a graph obtained by calculating characteristics of three terminals of a compound semiconductor device according to a comparative example.

FIG. 7B is a graph obtained by calculating characteristics of three terminals of the compound semiconductor device 1 according to the comparative example.

Note that, in FIGS. 7A and 7B, the horizontal axes represent the source-drain voltage and the vertical axes represent the drain current. Moreover, Vg denotes the gate voltage. These are also the case for FIGS. 11A, 11B, 15A, and 15B to be described later.

As illustrated in FIGS. 7A and 7B, the drain current in the present embodiment is higher than that in the comparative example at the same source-drain voltage.

From this result, it is confirmed that forming the first InAlN layer 34 and the second InAlN layer 35 as in the embodiment is effective in increasing the drain current.

Note that, when the composition ratio of In in each of the InAlN layers 34, 35 is arbitrary ratio, lattice mismatch may occur between the InAlN layers 34, 35 and the carrier transit layer 23 thereunder.

To deal with this problem, it is preferable to achieve lattice match between the InAlN layer 34, 35 and the carrier transit layer 23 by adjusting the composition ratio of In in each of the InAlN layers 34, 35.

Figure 8:
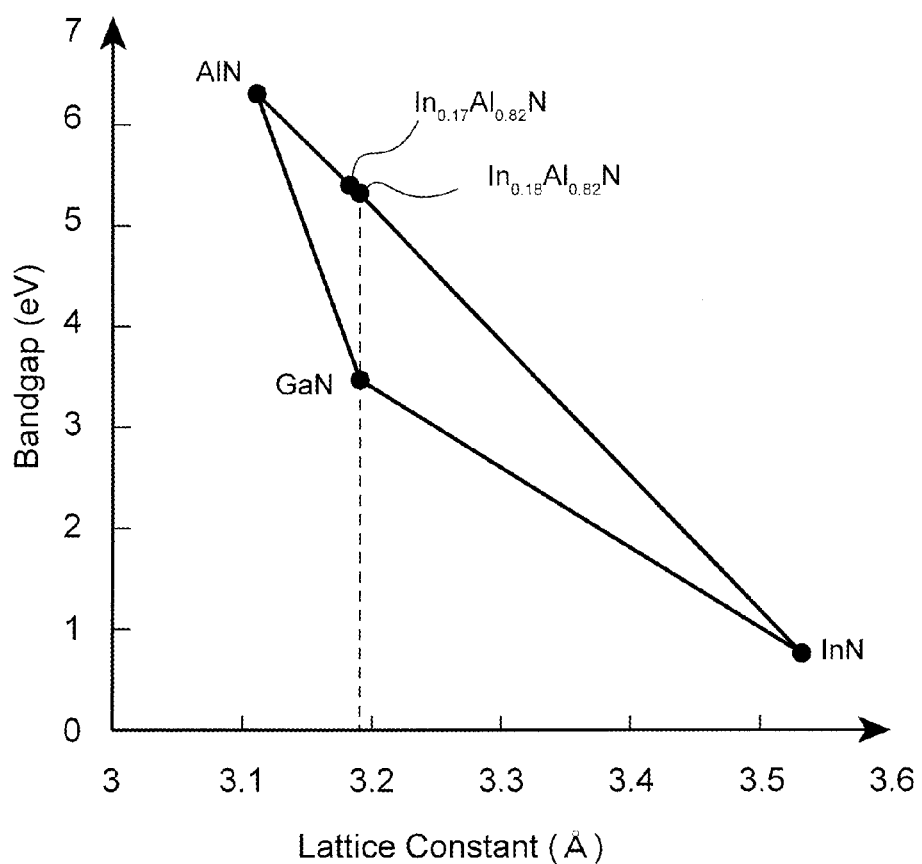
FIG. 8 is a graph illustrating relationships among the lattice constants and the band gaps of III-nitride semiconductors.

FIG. 8 is a graph illustrating relationships between the lattice constants and the band gaps of group III-nitride semiconductors.

As illustrated in FIG. 8, when the composition ratio of In in InAlN is equal to or more than 17% and equal to or less than 18%, the lattice constant of InAlN becomes substantially the same as the lattice constant of GaN which is the material of the carrier transit layer 23.

Accordingly, the composition ratio of In in each of the InAlN layers 34, 35 is preferably set to equal to or more than 17% and equal to or less than 18% to achieve lattice match between the InAlN layer 34, 35 and the carrier transit layer 23.

Second Embodiment

In the present embodiment, the density of the carriers in the carrier transit layer 23 is prevented from decreasing as follows.

FIGS. 9A to 9D are cross-sectional views of a compound semiconductor device in the course of manufacturing thereof according to the present embodiment. Note that, in FIGS. 9A to 9D, the same elements as those described in the first embodiment are denoted by the same reference numerals as those in the first embodiment, and description thereof is omitted below.

Figure 9A:
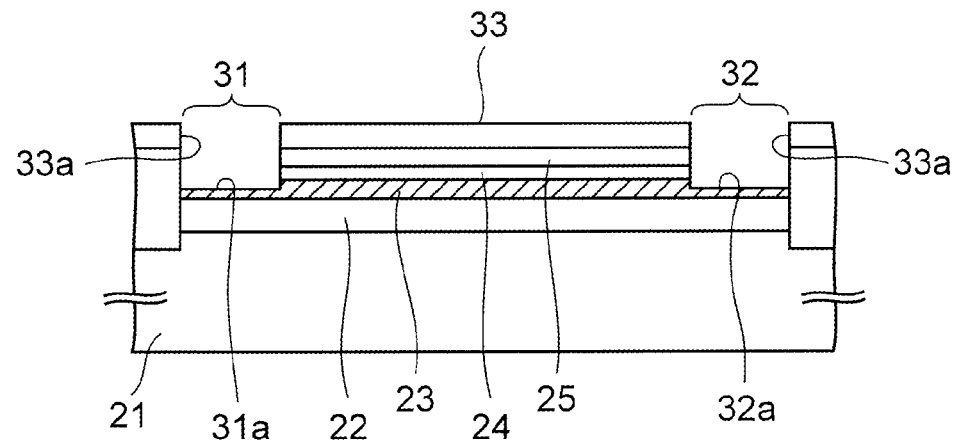
FIGS. 9A to 9D are cross-sectional views of a compound semiconductor device in the course of manufacturing thereof according to a second embodiment.

First, as illustrated in FIG. 9A, the steps in FIGS. 5A to 5E in the first embodiment are performed to obtain a structure in which the first recess 31 and the second recess 32 are formed in the carrier transit layer 23, the first intermediate layer 24, and the barrier layer 25.

The recesses 31, 32 have the first bottom surface 31a and the second bottom surface 32a respectively, and the carrier transit layer 23 is exposed on the bottom surfaces 31a, 32a.

Note that the mask layer 33 having the openings 33a overlapping with the recesses 31, 32 is formed on the barrier layer 25.

Figure 9B:
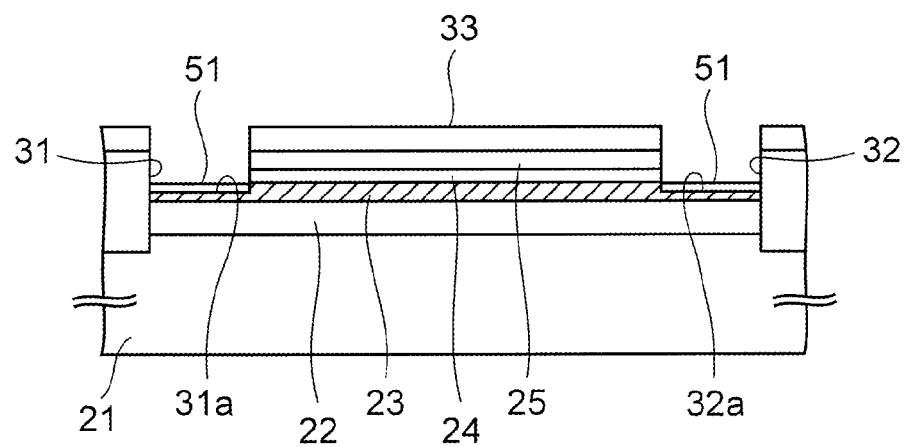

Next, as illustrated in FIG. 9B, an AlN layer having a thickness of about 0.5 nm is formed as a second intermediate layer 51 on the bottom surfaces 31a, 32a of the first recess 31 and the second recess 32 by the MOVPE method.

The film formation condition of the second intermediate layer 51 is not particularly limited. In the present embodiment, the second intermediate layer 51 is formed under the condition where a mixed gas of TMA gas, ammonia gas, and hydrogen gas is used as a film formation gas, the substrate temperature is 1000° C., and the pressure of a film formation atmosphere is 10 kPa.

Figure 9C:
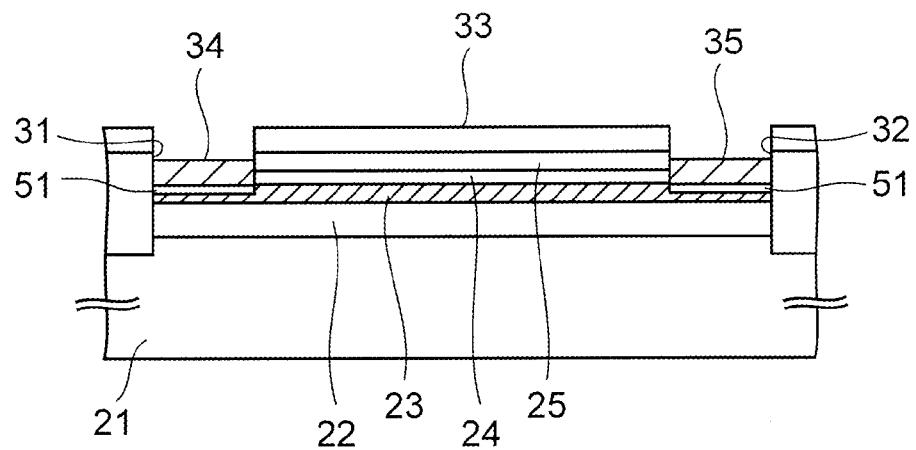

Next, as illustrated in FIG. 9C, the first InAlN layer 34 is regrown on the second intermediate layer 51 in the first recess 31, and the second InAlN layer 35 is regrown on the second intermediate layer 51 in the second recess 32.

The InAlN layers 34, 35 are regrown under the same growth condition as that in the first embodiment, and the thickness of the InAlN layers 34, 35 is about 5 nm, for example.

Figure 9D:
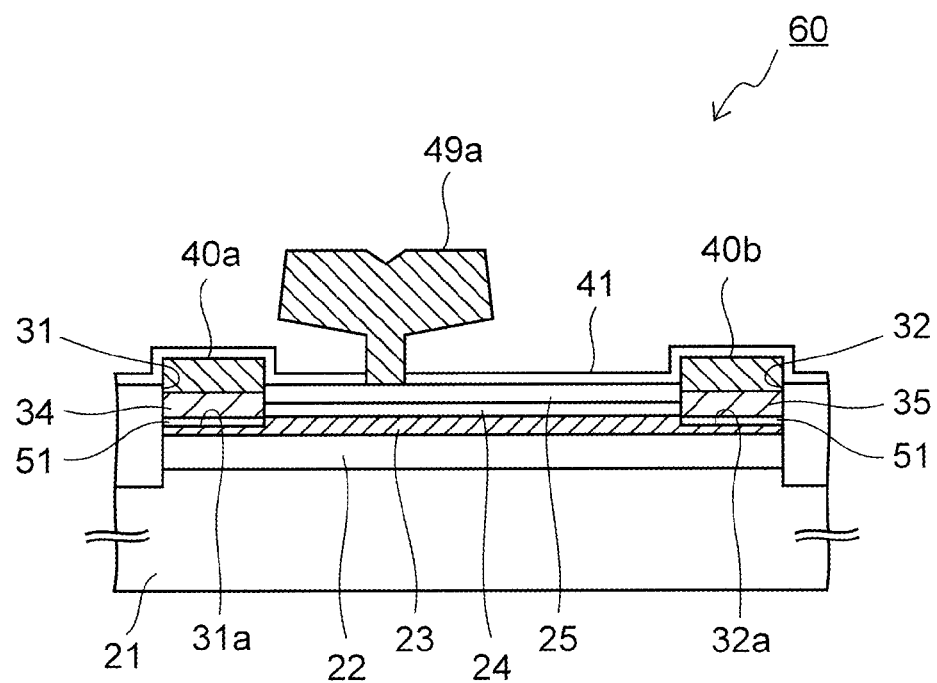

Thereafter, the steps of FIGS. 5G to 5M described in the first embodiment are performed to complete a basic structure of the compound semiconductor device 60 according to the present embodiment illustrated in FIG. 9D.

According to the present embodiment described above, the AlN layer is formed as the second intermediate layer 51 under the InAlN layers 34, 35. The AlN layer suppresses diffusion of In in the InAlN layers 34, 35 into the carrier transit layer 23 thereunder, which in turn prevents the carriers in the carrier transit layer 23 from decreasing due to the In.

Moreover, by forming the second intermediate layer 51 thinner than the first intermediate layer 24, the two-dimensional electron gas of a sufficient density can be induced in the carrier transit layer 23 due to the spontaneous polarization of the InAlN layers 34, 35.

On the other hand, when the second intermediate layer 51 is too thin, the In diffusion preventing capability of the second intermediate layer 51 decreases. The minimum film thickness at which the second intermediate layer 51 can prevent the diffusion of In is about 0.5 nm. Accordingly, it is preferable to form the second intermediate layer 51 having a thickness of 0.5 nm or more and thereby effectively prevent the diffusion of In from the InAlN layers 34, 35 to the carrier transit layer 23.

The inventors of the present application calculated an electron density distribution in the compound semiconductor device 60 in order to confirm the electron density in the case where the second intermediate layer 51 is formed in this manner.

Figure 10:
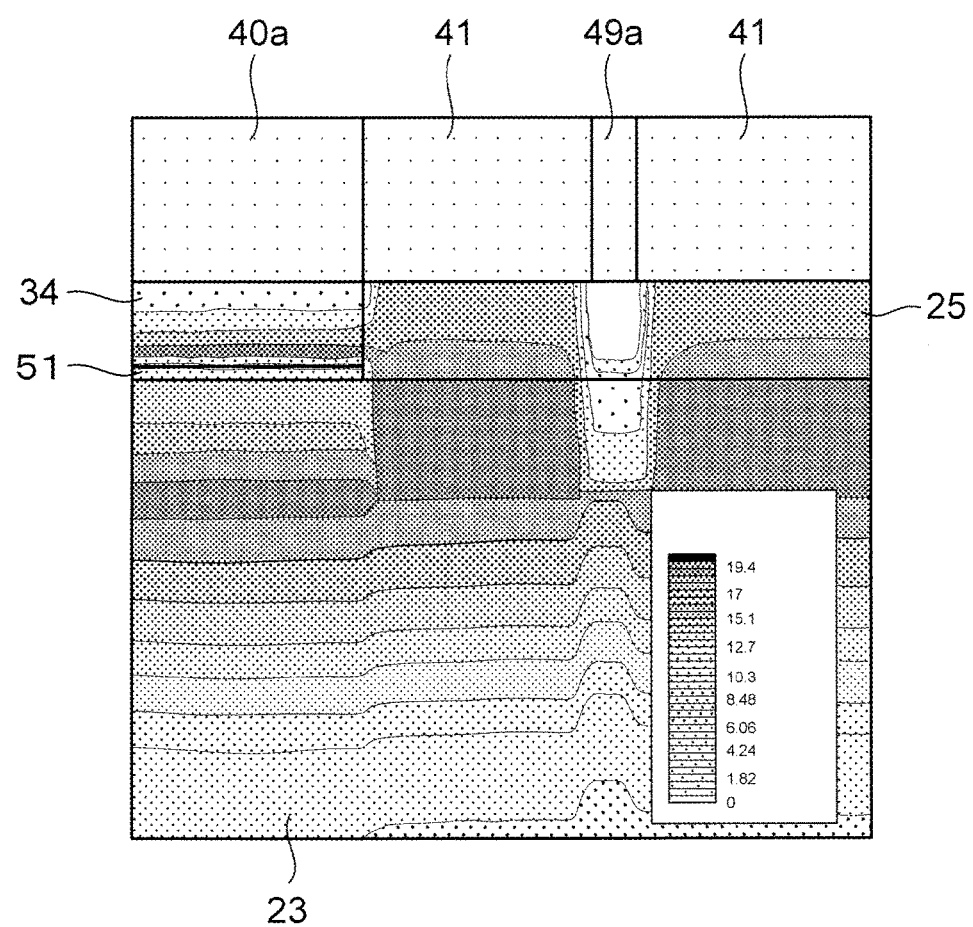
FIG. 10 is a diagram obtained by calculating an electron density distribution in the compound semiconductor device according to the second embodiment.

The result of this calculation is illustrated in FIG. 10. Note that the first intermediate layer 24 is omitted in this calculation.

As illustrated in FIG. 10, even when the second intermediate layer 51 is formed, the electron density becomes high in the carrier transit layer 23 under the second intermediate layer 51. Accordingly, as in the first embodiment, the two-dimensional electron gas induced in the carrier transit layer 23 facilitates the ohmic contact between the first InAlN layer 34 and the source electrode 40a, which makes it possible to reduce the contact resistance between the first InAlN layer 34 and the source electrode 40a.

Furthermore, the inventors of the present application calculated characteristics of three terminals of the compound semiconductor device 60 according to the present embodiment.

Figure 11A:
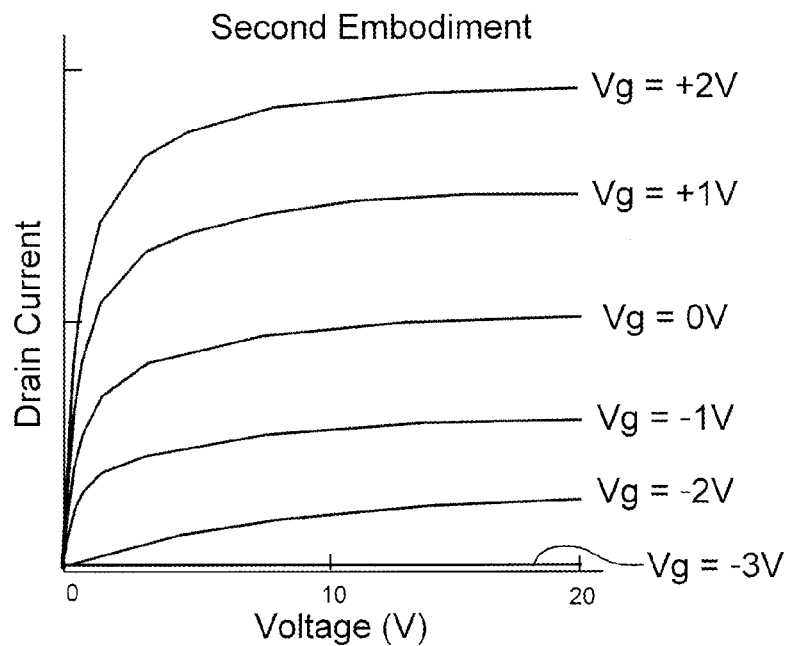
FIG. 11A is a graph obtained by calculating characteristics of three terminals of the compound semiconductor device according to the second embodiment.

The result of this calculation is illustrated in FIG. 11A. FIG. 11A is a graph obtained by calculating the characteristics of the three terminals of the compound semiconductor device 60 according to the present embodiment.

Figure 11B:
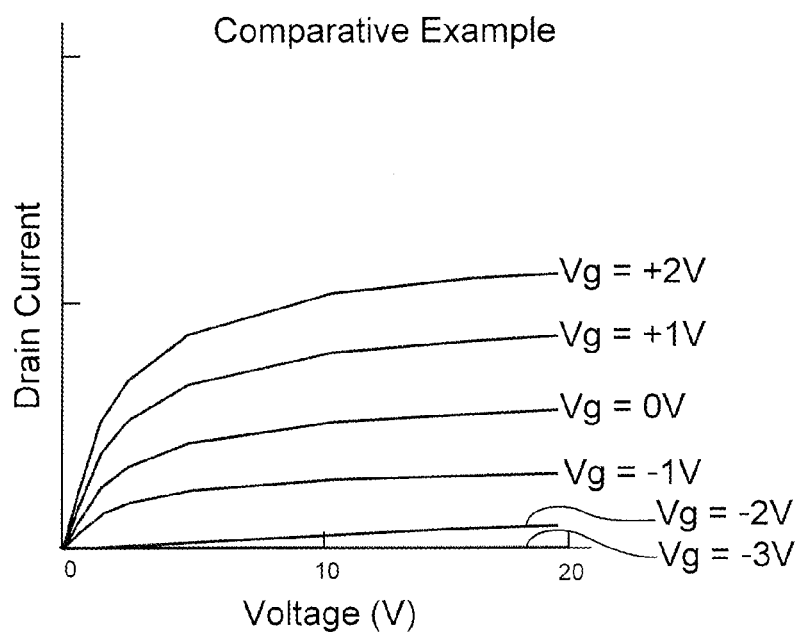
FIG. 11B is a graph obtained by calculating the characteristics of the three terminals of the compound semiconductor device according to the comparative example.

Note that FIG. 11B is a graph obtained by calculating the characteristics of the three terminals of the compound semiconductor device 1 (see FIG. 1) of the comparative example described in FIG. 7B.

As illustrated in FIGS. 11A and 11B, the drain current in the present embodiment is higher than that in the comparative example at the same source-drain voltage.

From this result, it is confirmed that, even when the second intermediate layer 51 is formed as in the present embodiment, the drain current increases by the effect of the first InAlN layer 34 and the second InAlN layer 35 as in the first embodiment.

Third Embodiment

In the present embodiment, the second intermediate layer 51 described in the second embodiment is formed also on the side surfaces of the recesses 31, 32.

FIGS. 12A to 12D are cross-sectional views of a compound semiconductor device in the course of manufacturing thereof according the present embodiment. Note that, in FIGS. 12A to 12D, the same elements as those described in the first and second embodiments are denoted by the same reference numerals as those in the first and second embodiments, and description thereof is omitted below.

Figure 12A:
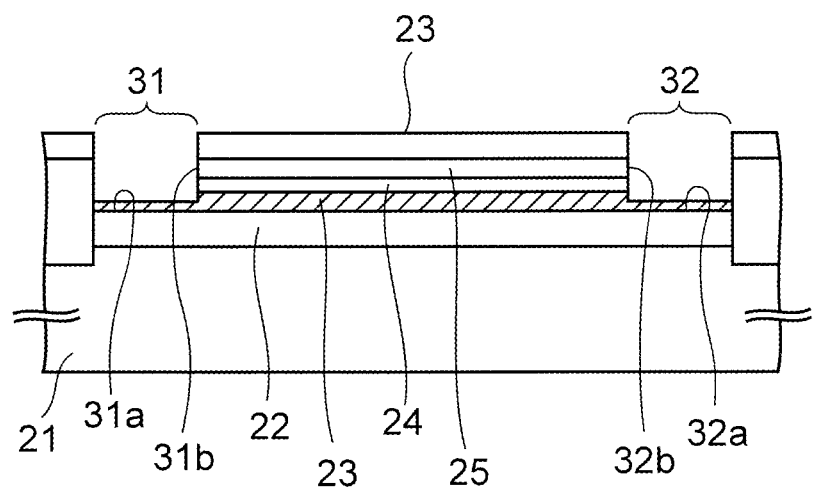
FIGS. 12A to 12D are cross-sectional views of a compound semiconductor device in the course of manufacturing thereof according to a third embodiment.

First, as illustrated in FIG. 12A, the steps of FIGS. 5A to 5E in the first embodiment are performed to obtain a structure in which the first recess 31 and the second recess 32 are formed in the carrier transit layer 23, the first intermediate layer 24, and the barrier layer 25.

Among them, the first recess 31 has the first bottom surface 31a and a first side surface 31b, and the barrier layer 25 is exposed on the first side surface 31b. Similarly, the second recess 32 has the second bottom surface 32a and a second side surface 32b, and the barrier layer 25 is exposed on the second side surface 32b.

Figure 12B:
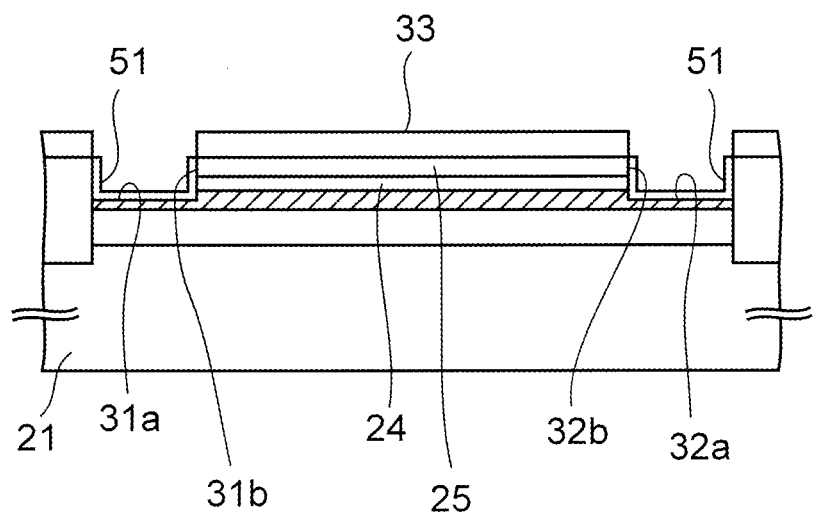

Next, as illustrated in FIG. 12B, an AlN layer having a thickness of about 0.5 nm is formed as the second intermediate layer 51 in the first recess 31 and the second recess 32 by the MOVPE method using a mixed gas of TMA gas, ammonia gas, and hydrogen gas as a film formation gas.

In the present embodiment, the second intermediate layer 51 is formed not only the bottom surfaces 31a, 32a of the recesses 31, 32 but also on the side surfaces 31b, 32b of the recesses 31, 32.

As the condition for forming the second intermediate layer 51 on the side surfaces 31b, 32b in this manner, such a condition is employed in the present embodiment where the substrate temperature is 600° C. and the pressure of a film formation atmosphere is 10 kPa.

Figure 12C:
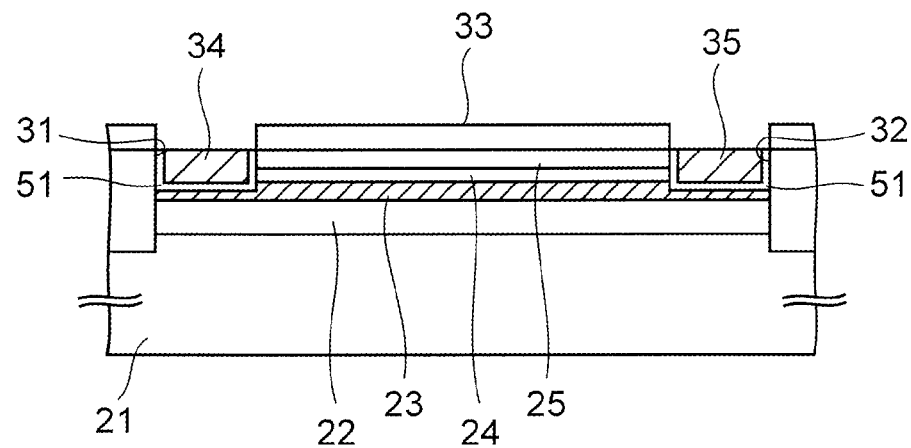

Next, as illustrated in FIG. 12C, the first InAlN layer 34 is regrown on the second intermediate layer 51 in the first recess 31, and the second InAlN layer 35 is regrown on the second intermediate layer 51 in the second recess 32.

These InAlN layers 34, 35 are regrown under the same growth condition as that in the first embodiment, and the thickness thereof is about 5 nm, for example.

Figure 12D:
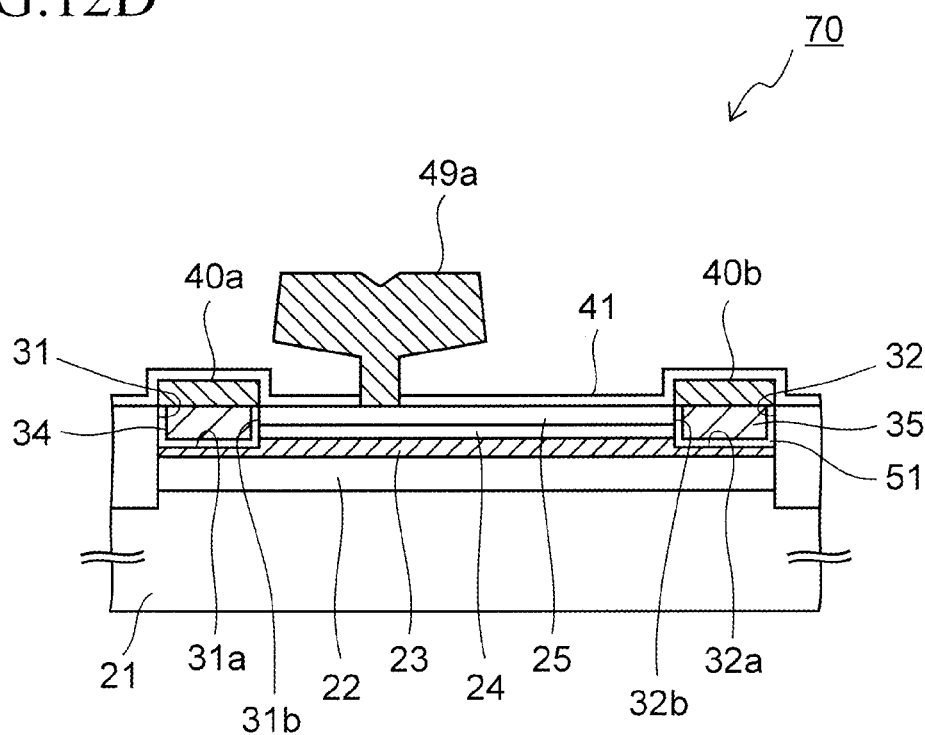

Thereafter, the steps in FIGS. 5G to 5M described in the first embodiment are performed to complete a basic structure of the compound semiconductor device 70 according to the present embodiment illustrated in FIG. 12D.

According to the present embodiment described above, the second intermediate layer 51 is formed also on the side surfaces 31b, 32b of the recesses 31, 32.

The AlN layer formed as the second intermediate layer 51 has a function of preventing In contained in the first InAlN layer 34 from diffusing in the substrate lateral direction and reaching the barrier layer 25. Therefore, in the present embodiment, it is possible to prevent the crystallinity of InGaAlN, which is the material of the barrier layer 25, from degrading due to In diffused from the first InAlN layer 34, which in turn makes it possible to suppress changes in the spontaneous polarization and the piezoelectric polarization of the barrier layer 25.

Due to the same reason, by forming the second intermediate layer 51 on the second side surface 32b, it is made possible to prevent In contained in the second InAlN layer 35 from diffusing into the barrier layer 25, thereby suppressing changes in the spontaneous polarization and the piezoelectric polarization of the barrier layer 25 due to the diffused In.

The inventors of the present application calculated an electron density distribution in the compound semiconductor device 70 to confirm the electron density in the case where the second intermediate layer 51 is formed on the side surfaces 31b, 32b in this manner.

Figure 13:
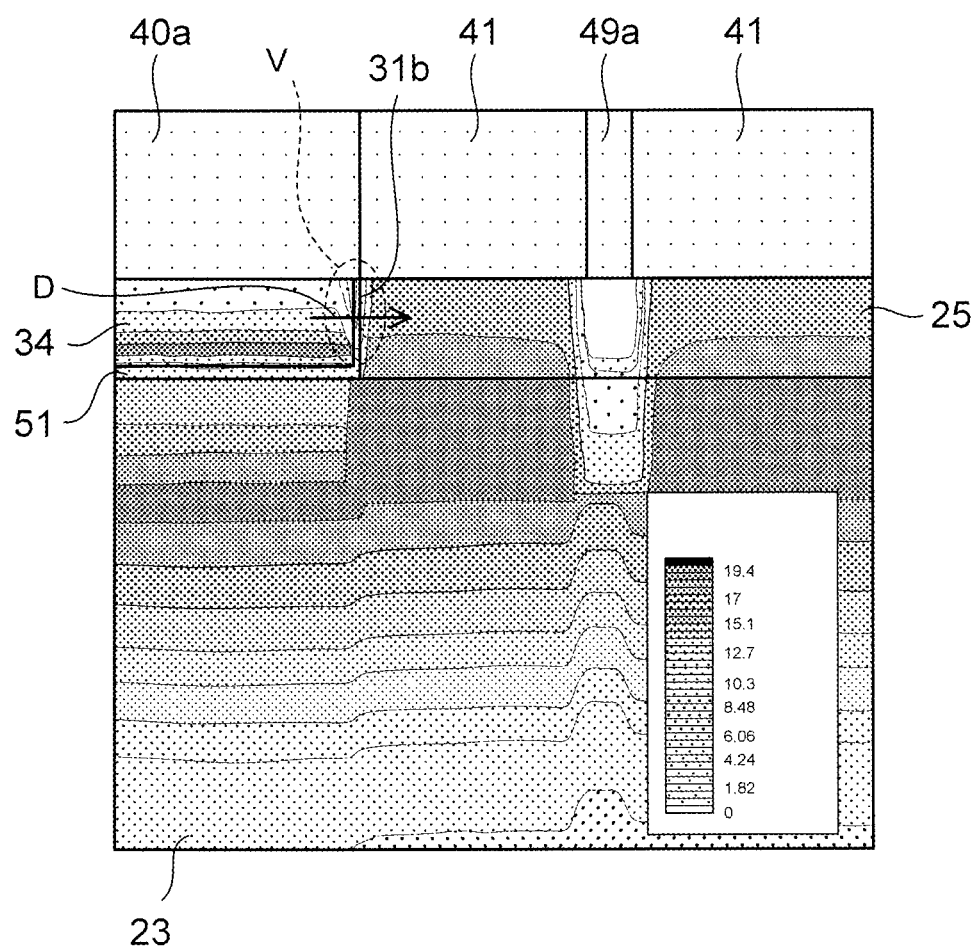
FIG. 13 is a diagram obtained by calculating an electron density distribution in the compound semiconductor device according to the third embodiment.

The result of this calculation is illustrated in FIG. 13. Note that the first intermediate layer 24 is omitted in this calculation.

As illustrated in FIG. 13, it is found that, even when the second intermediate layer 51 is formed on the first side surface 31b, a two-dimensional electron gas with an electron density as high as that in the second embodiment (see FIG. 10) is induced.

Moreover, it is found that, when the second intermediate layer 51 is formed on the first side surface 31b in this manner, a depletion layer V is formed around the first side surface 31b. The depletion layer V can prevent electrons from moving from the first InAlN layer 34 to the barrier layer 25 as illustrated by the arrow D, thereby making it possible to confine the flow of electrons within the carrier transit layer 23.

Fourth Embodiment

In the present embodiment, the InAlN layers 34, 35 are easily brought into ohmic contacts with the source electrode 40a and the drain electrode 40b as described below.

FIGS. 14A to 14D are cross-sectional views of a compound semiconductor device in the course of manufacturing thereof according the present embodiment. Note that, in FIGS. 14A to 14D, the same elements as those described in the first to third embodiments are denoted by the same reference numerals as those in the first to third embodiments, and description thereof is omitted below.

Figure 14A:
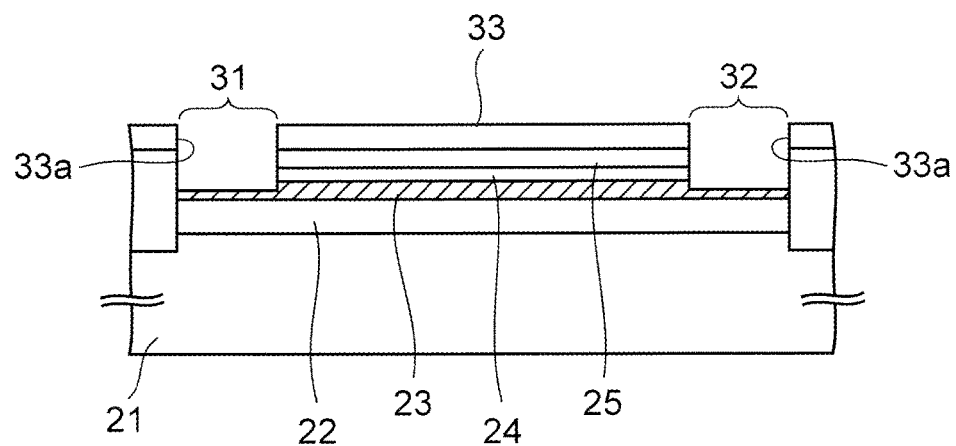
FIGS. 14A to 14D are cross-sectional views of a compound semiconductor device in the course of manufacturing thereof according to a fourth embodiment.

First, as illustrated in FIG. 14A, the steps of FIGS. 5A to 5E in the first embodiment are performed to obtain a structure in which the first recess 31 and the second recess 32 are formed in the carrier transit layer 23, the first intermediate layer 24, and the barrier layer 25.

Note that the mask layer 33 is formed on the barrier layer 25, and the recesses 31, 32 are exposed from the openings 33a of the mask layer 33.

Figure 14B:
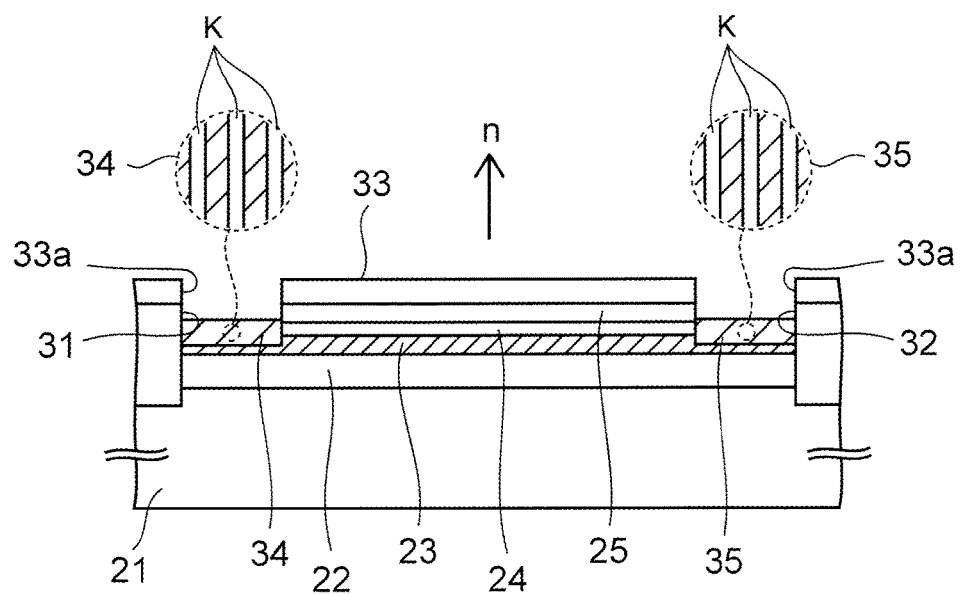

Next, as illustrated in FIG. 14B, the first InAlN layer 34 and the second InAlN layer 35 having a thickness of about 5 nm are regrown by the MOVPE method in the recesses 31, 32 exposed from the openings 33a of the mask layer 33. Note that a mixed gas of TMI gas, TMA gas, ammonia gas, and hydrogen gas is used as a film formation gas in this MOVPE method.

Depending on the film formation condition of the InAlN layers 34, 35, a plurality of threading dislocations is formed in the InAlN layers 34, 35. The threading dislocations are caused by In aggregations and pits formed on the surfaces of the InAlN layers 34, 35 during the film formation.

In the present embodiment, such a film forming condition is employed for the InAlN layers 34, 35 where the substrate temperature is 600° C. to 800° C. and the pressure of the film formation atmosphere is 5 kPa. This film formation condition promotes the formation of In aggregations and pits described above, and the plurality of threading dislocations K are formed in the InAlN layers 34, 35.

In each of the InAlN layers 34, 35, the threading dislocations K extend along the normal direction n of the substrate 21.

Figure 14C:
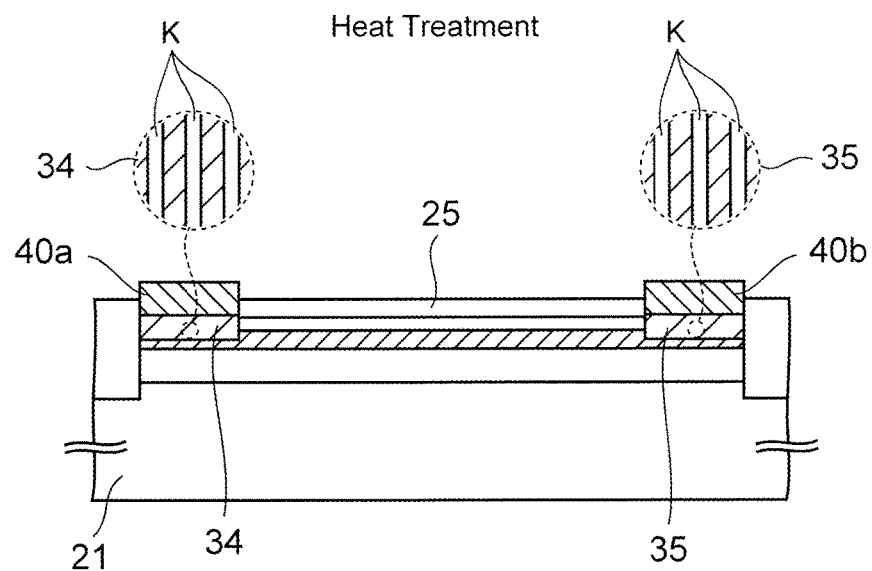

Next, as illustrated in FIG. 14C, the steps of FIGS. 5G to 5H described in the first embodiment are performed to form the source electrode 40a and the drain electrode 40b on the InAlN layers 34, 35 respectively.

Then, the source electrode 40a and the drain electrode 40b are heated in a nitrogen atmosphere under the condition where the substrate temperature is about 550° C. so as to cause the material of the source electrode 40a and the drain electrode 40b to diffuse into the InAlN layers 34, 35.

At this time, since the material of the source electrode 40a is easily diffused into the first InAlN layer 34 along the threading dislocations K in the present embodiment, the first InAlN layer 34 is easily brought into ohmic contact with the source electrode 40a.

Moreover, the second InAlN layer 35 is easily brought into ohmic contact with the drain electrode 40b by the same reason.

Figure 14D:
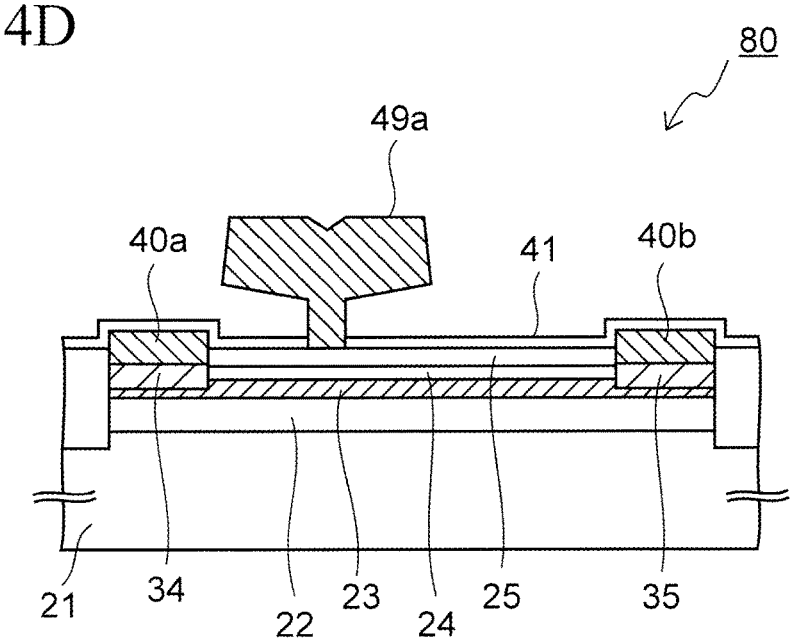

Thereafter, the steps of FIGS. 5J to 5M described in the first embodiment are performed to complete a basic structure of the compound semiconductor device 80 according to the present embodiment illustrated in FIG. 14D.

According to the present embodiment described above, since the material of the source electrode 40a diffuse along the threading dislocations K as illustrated in FIG. 14C, the first InAlN layers 34 is easily brought into ohmic contacts with the source electrode 40a, thereby making it possible to increase the drain current.

By the same reason, the second InAlN layers 35 is easily brought into ohmic contacts with the drain electrode 40b, and hence the drain current can further be increased.

The inventors of the present application calculated characteristics of three terminals of the compound semiconductor device 80 according to the present embodiment to confirm that the drain current is actually increased.

Figure 15A:
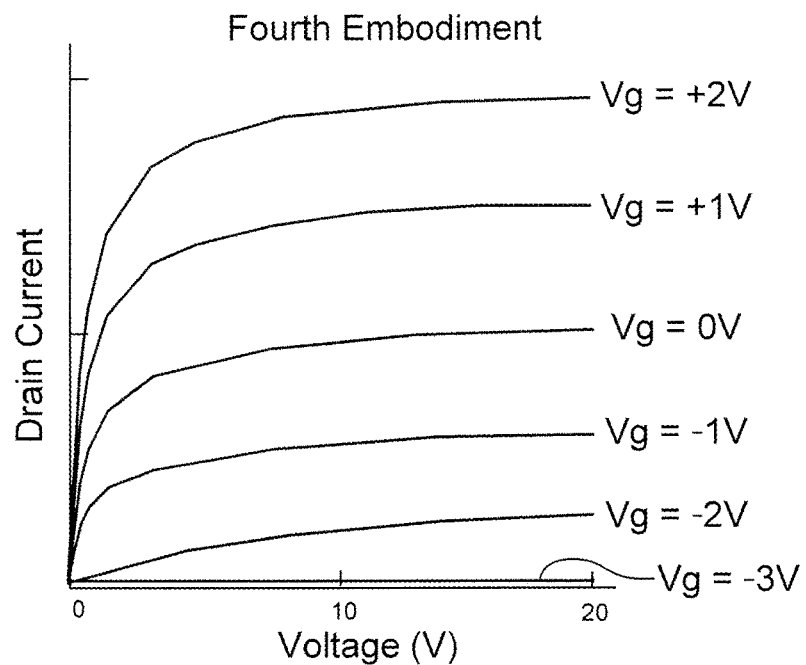
FIG. 15A is a graph obtained by calculating characteristics of three terminals of the compound semiconductor device according to the fourth embodiment.

The result of this calculation is illustrated in FIG. 15A. FIG. 15A is a graph obtained by calculating the characteristics of the three terminals of the compound semiconductor device 80 according to the present embodiment.

Figure 15B:
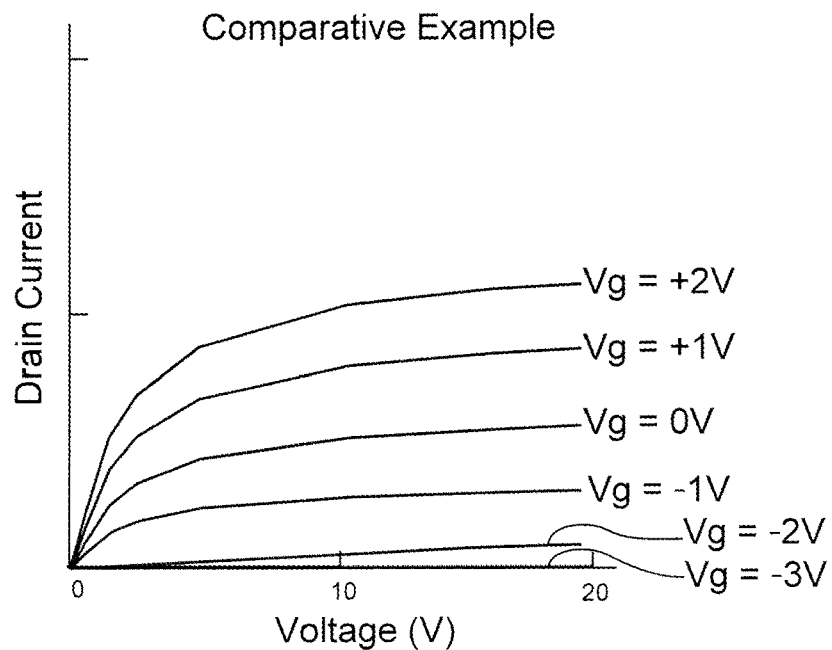
FIG. 15B is a graph obtained by calculating the characteristics of the three terminals of the compound semiconductor device according to the comparative example.

Note that FIG. 15B is a graph obtained by calculating the characteristics of three terminals of the compound semiconductor device 1 according to the comparative example described in FIG. 7B.

As illustrated in FIGS. 15A and 15B, the drain current in the present embodiment is higher than that in the comparative example at the same source-drain voltage.

From this result, it is confirmed that forming the threading dislocations K in the InAlN layers 34, 35 as in the present embodiment is effective for increasing the drain current.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A compound semiconductor device comprising:
    a substrate;
    a carrier transit layer formed on the substrate and made of GaN;
    a barrier layer made of a nitride semiconductor and formed on the carrier transit layer, where a barrier is formed between the carrier transit layer and the barrier layer;
    a first recess that passes through the barrier layer and has a depth reaching the carrier transit layer;
    a second recess that passes through the barrier layer and has a depth reaching the carrier transit layer, the second recess being formed at an interval from the first recess;
    a first InAlN layer that is formed in the first recess separately from the barrier layer, a composition ratio of In in the first InAlN layer being equal to or more than 17% and equal to or less than 18%;
    a second InAlN layer that is formed in the second recess separately from the barrier layer, a composition ratio of In in the second InAlN layer being equal to or more than 17% and equal to or less than 18%;
    a source electrode that is formed on the first InAlN layer formed in the first recess;
    a drain electrode that is formed on the second InAlN layer formed in the second recess; and
    a gate electrode formed on the barrier layer between the source electrode and the drain electrode.

2. The compound semiconductor device according to claim 1, further comprising:
    a first intermediate layer formed on bottom surfaces of the first recess and the second recess and made of AlN, wherein
    the first InAlN layer is formed on the first intermediate layer in the first recess, and
    the second InAlN layer is formed on the first intermediate layer in the second recess.

3. The compound semiconductor device according to claim 2, further comprising:
    a second intermediate layer formed on the carrier transit layer and made of AlN,
    wherein the barrier layer is formed on the second intermediate layer, and the first intermediate layer is thinner than the second intermediate layer.

4. The compound semiconductor device according to claim 2, wherein
    the first recess includes a first side surface on which the barrier layer is exposed,
    the second recess includes a second side surface on which the barrier layer is exposed, and
    the first intermediate layer is formed also on the first side surface and the second side surface.

5. The compound semiconductor device according to claim 1, wherein a threading dislocation extending along a normal direction of the substrate is formed in each of the first InAlN layer and the second InAlN layer.

6. The compound semiconductor device according to claim 1, wherein the barrier layer is an InAlGaN layer.

7. A method of manufacturing a compound semiconductor device, the method comprising:
   forming a carrier transit layer made of GaN on a substrate;
   forming a barrier layer made of a nitride semiconductor on the carrier transit layer, where a barrier is formed between the carrier transit layer and the barrier layer;
   forming a first recess that passes through the barrier layer, the first recess having a depth reaching the carrier transit layer;
   forming a second recess that passes through the barrier layer and has a depth reaching the carrier transit layer, the second recess being formed at an interval from the first recess;
   forming a first InAlN layer in the first recess separately from the barrier layer, a composition ratio of In in the first InAlN layer being equal to or more than 17% and equal to or less than 18%;
   forming a second InAlN layer in the second recess separately from the barrier layer, a composition ratio of In in the second InAlN layer being equal to or more than 17% and equal to or less than 18%;
   forming a source electrode on the first InAlN layer formed in the first recess;
   forming a drain electrode on the second InAlN layer formed in the second recess; and
   forming a gate electrode on the barrier layer between the source electrode and the drain electrode.

8. The method of manufacturing a compound semiconductor device according to claim 7, the method further comprising:
   forming a first intermediate layer made of AlN on bottom surfaces of each of the first recess and the second recess, wherein
   in the forming a first InAlN layer, the first InAlN layer is formed on the first intermediate layer in the first recess, and
   in the forming a second InAlN layer, the second InAlN layer is formed on the first intermediate layer in the second recess.

9. The method of manufacturing a compound semiconductor device according to claim 8, the method further comprising:
   forming a second intermediate layer made of AlN on the carrier transit layer, wherein the first intermediate layer is thinner than the second intermediate layer.

10. The method of manufacturing a compound semiconductor device according to claim 8, wherein
    in the forming a first recess, a first side surface on which the barrier layer is exposed is formed in the first recess,
    in the forming a second recess, a second side surface on which the barrier layer is exposed is formed in the second recess,
    in the forming a first intermediate layer, the first intermediate layer is formed also on the first side surface and the second side surface.

11. The method of manufacturing a compound semiconductor device according to claim 7, wherein
    in the forming a first InAlN layer, a threading dislocation extending along a normal direction of the substrate is formed in the first InAlN layer, and
    in the forming a second InAlN layer, a threading dislocation extending along the normal direction of the substrate is formed in the second InAlN layer.

* * * * *